United States Patent
Geng et al.

(10) Patent No.: US 10,594,530 B2
(45) Date of Patent: Mar. 17, 2020

(54) TECHNIQUES FOR SUCCESSIVE PEAK REDUCTION CREST FACTOR REDUCTION

(71) Applicant: QUALCOMM Incorporated, San Diego, CA (US)

(72) Inventors: Jifeng Geng, San Diego, CA (US); Feng Wang, San Diego, CA (US); Insung Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/991,759

(22) Filed: May 29, 2018

(65) Prior Publication Data

US 2019/0372817 A1    Dec. 5, 2019

(51) Int. Cl.
| | |
|---|---|
| *H04L 27/26* | (2006.01) |
| *H04B 1/04* | (2006.01) |
| *G01R 23/16* | (2006.01) |
| *H04W 24/02* | (2009.01) |

(52) U.S. Cl.
CPC ....... *H04L 27/2624* (2013.01); *H04B 1/0475* (2013.01); *H04L 27/2621* (2013.01); *G01R 23/16* (2013.01); *H04W 24/02* (2013.01)

(58) Field of Classification Search
CPC ............ H04L 27/2624; H04L 27/2621; H04B 1/0475; H04W 24/02; G01R 23/16
See application file for complete search history.

(56) References Cited

U.S. PATENT DOCUMENTS

| | | | | |
|---|---|---|---|---|
| 5,287,387 A | * | 2/1994 | Birchler | .................... H03K 5/08 332/159 |
| 5,524,172 A | * | 6/1996 | Hamon | .................... G10L 13/07 704/268 |
| 5,576,480 A | * | 11/1996 | Hopkins | .............. B01D 65/102 73/38 |
| 5,638,403 A | * | 6/1997 | Birchler | ................. H04B 7/005 332/159 |

(Continued)

FOREIGN PATENT DOCUMENTS

WO    WO-2013095251 A2  *  6/2013

OTHER PUBLICATIONS

International Search Report and Written Opinion—PCT/US2019/031127—ISA/EPO—dated Jul. 25, 2019.

*Primary Examiner* — Berhanu Tadese
(74) *Attorney, Agent, or Firm* — Holland & Hart LLP

(57) ABSTRACT

Methods, systems, and devices for wireless communications are described. The described methods, systems, and devices may include sampling an input signal to obtain one or more signal windows. An amplitude of a first sample within a first signal window of the one or more signal windows may be determined to exceed an amplitude threshold. A series of cancellation pulses may be combined with the first sample within the first signal window to obtain a reduced signal, the reduced signal including one or more reduced samples each having an amplitudes within the amplitude threshold. The series of cancellation pulses may be based on a characteristic of the first sample. The reduced signal may then be transmitted. The series of cancellation pulses may be based on, for example, an envelope of the first sample. In some cases, the series of cancellation pulses may be based on a phase of the first sample.

30 Claims, 15 Drawing Sheets

(56) References Cited

U.S. PATENT DOCUMENTS

| | | | |
|---|---|---|---|
| 6,288,794 B1* | 9/2001 | Honary | G06T 3/40 358/1.1 |
| 6,741,661 B2* | 5/2004 | Wheatley, III | H04B 1/707 375/296 |
| 6,983,026 B2* | 1/2006 | Pinckley | H03F 1/3252 375/296 |
| 7,013,161 B2* | 3/2006 | Morris | H03G 7/002 375/261 |
| 7,107,303 B2* | 9/2006 | Kablotsky | H04B 3/237 708/322 |
| 7,349,817 B2* | 3/2008 | Cha | H04L 27/2614 370/208 |
| 7,467,338 B2* | 12/2008 | Saul | H04L 27/2604 375/350 |
| 7,634,024 B2* | 12/2009 | Tan | H04L 27/2624 370/208 |
| 7,965,761 B2* | 6/2011 | Shattil | H04B 1/7174 375/147 |
| 7,991,040 B2* | 8/2011 | van Veen | H04L 27/2615 370/280 |
| 8,102,941 B2* | 1/2012 | Hamada | H04B 1/0475 375/297 |
| 8,254,478 B2* | 8/2012 | Hellberg | H04L 27/2618 375/260 |
| 8,340,210 B2* | 12/2012 | Haddad | H04L 27/2624 375/295 |
| 8,457,249 B2* | 6/2013 | Gotman | H04L 27/2624 375/260 |
| 8,577,677 B2* | 11/2013 | Kim | G10L 21/0272 704/228 |
| 8,599,961 B2* | 12/2013 | Schmidt | H04L 27/2624 375/296 |
| 8,619,903 B2* | 12/2013 | Schmidt | H04L 27/2624 375/296 |
| 8,649,471 B1* | 2/2014 | Charbonneau | H04L 27/2624 341/132 |
| 8,862,649 B2* | 10/2014 | Kang | H04L 27/2624 708/319 |
| 8,897,388 B2* | 11/2014 | Molina | H04L 1/0054 375/295 |
| 8,982,992 B2* | 3/2015 | Azadet | H04L 1/0054 375/296 |
| 9,014,319 B1* | 4/2015 | Copeland | H04L 27/2624 375/350 |
| 9,160,594 B1* | 10/2015 | Copeland | H04L 27/2624 |
| 9,215,120 B2* | 12/2015 | Rexberg | H04L 27/2624 |
| 9,292,255 B2* | 3/2016 | Azadet | H04L 1/0054 |
| 9,313,078 B1 | 4/2016 | Barman | H04L 27/2624 |
| 9,391,649 B2* | 7/2016 | Wang | H04L 27/0008 |
| 9,455,860 B2* | 9/2016 | Feng | H04L 27/2623 |
| 9,778,902 B2* | 10/2017 | Azadet | H04L 1/0054 |
| 9,998,314 B1* | 6/2018 | Mattsson | H04L 27/2623 |
| 10,084,630 B2* | 9/2018 | Ng | H04B 1/04 |
| 2002/0176480 A1* | 11/2002 | Wheatley, III | H04B 1/707 375/130 |
| 2003/0149495 A1* | 8/2003 | Hodges | H04M 9/08 700/67 |
| 2003/0179829 A1* | 9/2003 | Pinckley | H03F 1/3252 375/295 |
| 2004/0052314 A1* | 3/2004 | Copeland | H04B 1/707 375/296 |
| 2004/0076247 A1* | 4/2004 | Barak | H04L 27/2623 375/350 |
| 2004/0203430 A1* | 10/2004 | Morris | H03G 7/002 455/67.11 |
| 2004/0236572 A1* | 11/2004 | Bietrix | G10L 19/0212 704/211 |
| 2004/0264561 A1* | 12/2004 | Alexander | H04L 25/0204 375/232 |
| 2005/0063485 A1* | 3/2005 | Hasegawa | H04B 1/707 375/296 |
| 2006/0029158 A1* | 2/2006 | Lipka | H04L 5/026 375/300 |
| 2006/0133524 A1* | 6/2006 | Hamada | H04L 27/2614 375/260 |
| 2006/0171486 A1* | 8/2006 | Tan | H04L 27/2624 375/296 |
| 2006/0247898 A1* | 11/2006 | Cha | H04L 27/2614 702/188 |
| 2007/0041459 A1* | 2/2007 | Yeon | H04L 27/2624 375/260 |
| 2007/0089015 A1* | 4/2007 | Saul | H04L 27/2604 714/746 |
| 2007/0178853 A1* | 8/2007 | Hamada | H04L 27/2623 455/103 |
| 2007/0211786 A1* | 9/2007 | Shattil | H04B 1/707 375/141 |
| 2007/0217490 A1* | 9/2007 | Blake | H04L 27/2626 375/222 |
| 2008/0013646 A1* | 1/2008 | Hamada | H04B 1/0475 375/297 |
| 2009/0097579 A1* | 4/2009 | Yeon | H04L 25/03343 375/260 |
| 2009/0110033 A1* | 4/2009 | Shattil | H04B 1/7174 375/141 |
| 2010/0008442 A1* | 1/2010 | Hellberg | H04L 27/2618 375/267 |
| 2010/0158166 A1* | 6/2010 | Gandhi | H03F 1/3247 375/345 |
| 2011/0116383 A1* | 5/2011 | Lipka | H04L 5/0058 370/241 |
| 2011/0158336 A1* | 6/2011 | Jiang | H04L 27/2614 375/260 |
| 2011/0182339 A1* | 7/2011 | Kang | H04L 27/2624 375/224 |
| 2011/0255627 A1* | 10/2011 | Gotman | H04L 27/2624 375/285 |
| 2011/0258244 A1* | 10/2011 | Kang | H04L 27/2624 708/207 |
| 2011/0261896 A1* | 10/2011 | Haddad | H04L 27/2624 375/268 |
| 2012/0093209 A1* | 4/2012 | Schmidt | H04L 27/2624 375/224 |
| 2012/0093210 A1* | 4/2012 | Schmidt | H04L 27/2624 375/224 |
| 2013/0072139 A1* | 3/2013 | Kang | H04B 1/0475 455/114.3 |
| 2013/0114652 A1* | 5/2013 | Molina | H04L 1/0054 375/219 |
| 2013/0114761 A1* | 5/2013 | Azadet | H04L 1/0054 375/296 |
| 2013/0163512 A1* | 6/2013 | Rexberg | H04L 27/2624 370/328 |
| 2013/0287145 A1* | 10/2013 | Park | H04L 25/00 375/319 |
| 2014/0044215 A1* | 2/2014 | Mundarath | H04L 27/2624 375/297 |
| 2014/0072073 A1* | 3/2014 | Azadet | H04L 1/0054 375/296 |
| 2014/0079248 A1* | 3/2014 | Short | G10L 21/0272 381/119 |
| 2014/0086356 A1* | 3/2014 | Azadet | H04L 1/0054 375/295 |
| 2014/0140452 A1* | 5/2014 | Gandhi | H04B 1/0475 375/346 |
| 2014/0169496 A1* | 6/2014 | Yang | H04B 1/0475 375/296 |
| 2014/0269987 A1* | 9/2014 | Gubeskys | H04L 27/2624 375/296 |
| 2014/0355718 A1* | 12/2014 | Guan | H03C 5/00 375/300 |
| 2015/0349994 A1* | 12/2015 | Feng | H04L 1/20 375/260 |
| 2016/0056858 A1* | 2/2016 | Harrison | H04B 1/707 375/140 |
| 2016/0173311 A1* | 6/2016 | Farabegoli | H03F 1/02 455/127.1 |

(56) References Cited

U.S. PATENT DOCUMENTS

| | | | | |
|---|---|---|---|---|
| 2016/0337155 A1* | 11/2016 | Martynovich | ........... | H04B 1/04 |
| 2017/0026216 A1* | 1/2017 | Zhao | ................... | H04L 27/2623 |
| 2017/0187550 A1* | 6/2017 | Kim | ....................... | H04L 25/02 |
| 2017/0187560 A1* | 6/2017 | Ng | ............................ | H03F 3/24 |
| 2017/0288923 A1* | 10/2017 | Senaratne | ............... | H04L 27/22 |
| 2018/0278452 A1* | 9/2018 | Yang | ................... | H04L 27/2614 |
| 2018/0331873 A1* | 11/2018 | Andre | ................. | H04L 27/2614 |

* cited by examiner

TECHNIQUES FOR SUCCESSIVE PEAK REDUCTION CREST FACTOR REDUCTION

BACKGROUND

The following relates generally to wireless communication, and more specifically to successive peak reduction (SPR) crest factor reduction (CFR).

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-orthogonal frequency-division multiplexing (OFDM) (DFT-s-OFDM). A wireless multiple-access communications system may include a number of base stations or network access nodes, each simultaneously supporting communication for multiple communication devices, which may be otherwise known as user equipment (UE).

A UE or a base station operating in such a wireless communications system may include one or more co-located transceivers for sending and receiving transmissions to other devices in the wireless communications system. In some cases, the peak-to-average power ratio (PAPR) of single carrier FDMA (SC-FDMA) or OFDMA transmission may be relatively high, which may cause reduced throughput in the wireless communications system.

SUMMARY

The described techniques relate to improved methods, systems, devices, or apparatuses that support successive peak reduction (SPR) crest factor reduction (CFR). Generally, the described techniques provide for sampling an input signal to obtain one or more signal windows. In some cases, an amplitude of a first sample within a first signal window of the one or more signal windows may be determined to exceed an amplitude threshold. A series of cancellation pulses may then be combined with the first sample within the first signal window to obtain a reduced signal, where samples within the reduced signal may be reduced via below the amplitude threshold. Accordingly, the reduced signal may include one or more reduced samples, where each may have an amplitude within the amplitude threshold. In some cases, the series of cancellation pulses may be based on a characteristic of the first sample. The reduced signal may then be transmitted to a receiving device. The series of cancellation pulses may be based on, for example, an envelope of the first sample. In some cases, the series of cancellation pulses may be based on a phase of the first sample.

A method of wireless communication is described. The method may include sampling an input signal to obtain one or more signal windows and determining that an amplitude of a first sample within a first signal window of the one or more signal windows exceeds an amplitude threshold. The method may include combining a series of cancellation pulses with the first sample within the first signal window to obtain a reduced signal, where the reduced signal may include one or more reduced samples with amplitudes within the amplitude threshold and the series of cancellation pulses may be based at least in part on a characteristic of the first sample. The method may include transmitting the reduced signal.

An apparatus for wireless communication is described. The apparatus may include means for sampling an input signal to obtain one or more signal windows and means for determining that an amplitude of a first sample within a first signal window of the one or more signal windows exceeds an amplitude threshold. The apparatus may include means for combining a series of cancellation pulses with the first sample within the first signal window to obtain a reduced signal, where the reduced signal may include one or more reduced samples with amplitudes within the amplitude threshold and the series of cancellation pulses may be based at least in part on a characteristic of the first sample. The apparatus may include means for transmitting the reduced signal.

Another apparatus for wireless communication is described. The apparatus may include a processor, memory in electronic communication with the processor, and instructions stored in the memory. The instructions may be operable to cause the processor to sample an input signal to obtain one or more signal windows and determine that an amplitude of a first sample within a first signal window of the one or more signal windows exceeds an amplitude threshold. The instructions may be operable to cause the processor to combine a series of cancellation pulses with the first sample within the first signal window to obtain a reduced signal, where the reduced signal may include one or more reduced samples with amplitudes within the amplitude threshold and the series of cancellation pulses may be based at least in part on a characteristic of the first sample. The instructions may be operable to cause the processor to transmit the reduced signal.

A non-transitory computer-readable medium for wireless communication is described. The non-transitory computer-readable medium may include instructions operable to cause a processor to sample an input signal to obtain one or more signal windows and determine that an amplitude of a first sample within a first signal window of the one or more signal windows exceeds an amplitude threshold. The non-transitory computer-readable medium may include instructions operable to cause a processor to combine a series of cancellation pulses with the first sample within the first signal window to obtain a reduced signal, where the reduced signal may include one or more reduced samples with amplitudes within the amplitude threshold and the series of cancellation pulses based at least in part on a characteristic of the first sample. The non-transitory computer-readable medium may include instructions operable to cause a processor to transmit the reduced signal.

In some examples of the method, apparatus, and non-transitory computer-readable medium described above, the characteristic of the first sample may include an envelope of the first sample. In some examples of the method, apparatus, and non-transitory computer-readable medium described above, the series of cancellation pulses may be based at least in part on a phase of the first sample.

Some examples of the method, apparatus, and non-transitory computer-readable medium described above may further include processes, features, means, or instructions for determining that an amplitude of a second sample within a second signal window of the one or more signal windows of the reduced signal exceeds the amplitude threshold, where the series of cancellation pulses may be based at least in part on an characteristic of the second sample.

In some examples of the method, apparatus, and non-transitory computer-readable medium described above, the series of cancellation pulses may include a first cancellation pulse and a second cancellation pulse, the envelope of the second sample may be based at least in part on the first cancellation pulse, and the second cancellation pulse may be based at least in part on the envelope of the second sample. In some examples of the method, apparatus, and non-transitory computer-readable medium described above, the series of cancellation pulses may be based at least in part on a phase of the first sample and a phase of the second sample, where the phase of the first sample and the phase of the second sample may be different. Some examples of the method, apparatus, and non-transitory computer-readable medium described above may further include processes, features, means, or instructions for determining that an amplitude of a third sample within a third signal window of the one or more signal windows exceeds the amplitude threshold, where the series of cancellation pulses may be based at least in part on an envelope of the third sample.

In some examples of the method, apparatus, and non-transitory computer-readable medium described above, the series of cancellation pulses may include a recursive series of cancellation pulses.

In some examples of the method, apparatus, and non-transitory computer-readable medium described above, an amplitude of the one or more reduced samples of the reduced signal may be less than the amplitude threshold.

Some examples of the method, apparatus, and non-transitory computer-readable medium described above may further include processes, features, means, or instructions for applying a frequency domain rotation to the series of cancellation pulses within the first signal window to obtain a series of frequency shifted cancellation pulses, the series of frequency shifted cancellation pulses being frequency shifted relative to the input signal, where combining the series of cancellation pulses with the first sample may include combining the series of frequency shifted cancellation pulses with the first sample.

Some examples of the method, apparatus, and non-transitory computer-readable medium described above may further include processes, features, means, or instructions for applying a first frequency domain rotation to the input signal to obtain a rotated input signal including the first sample. Some examples of the method, apparatus, and non-transitory computer-readable medium described above may further include processes, features, means, or instructions for applying a second frequency domain rotation to the reduced signal. In some examples of the method, apparatus, and non-transitory computer-readable medium described above, the second frequency domain rotation may be different than the first frequency domain rotation.

Some examples of the method, apparatus, and non-transitory computer-readable medium described above may further include processes, features, means, or instructions for determining a length of the one or more signal windows based at least in part on a bandwidth of the input signal, a sampling rate of the input signal, a resource block allocation of the input signal, or a combination thereof.

In some examples of the method, apparatus, and non-transitory computer-readable medium described above, the series of cancellation pulses may be based at least in part on a Hanning window. In some examples of the method, apparatus, and non-transitory computer-readable medium described above, a length of the Hanning window may be the same as a length of a signal window of the one or more signal windows.

Some examples of the method, apparatus, and non-transitory computer-readable medium described above may further include processes, features, means, or instructions for processing the reduced signal with a filter to obtain a filtered reduced signal. Some examples of the method, apparatus, and non-transitory computer-readable medium described above may further include processes, features, means, or instructions for applying hard clipping to the filtered reduced signal to obtain an output signal to transmit the reduced signal. Some examples of the method, apparatus, and non-transitory computer-readable medium described above may further include processes, features, means, or instructions for applying a trough conditioner to the input signal.

In some examples of the method, apparatus, and non-transitory computer-readable medium described above, a peak-to-average power ratio (PAPR) of the output signal may be within a target PAPR.

DETAILED DESCRIPTION

Figure 1:
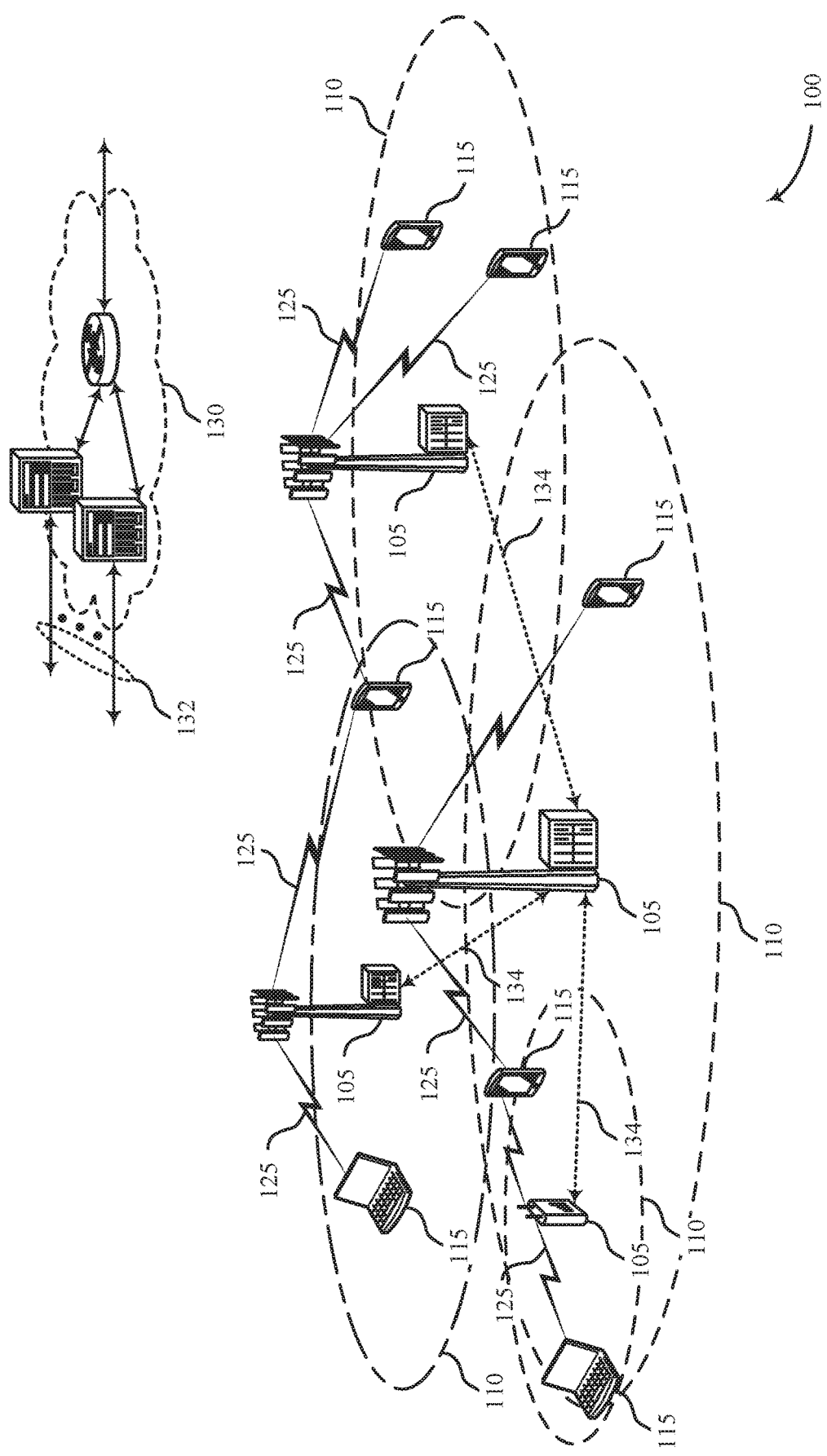
FIG. 1 illustrates an example of a wireless communications system that supports successive peak reduction (SPR) crest factor reduction (CFR) in accordance with aspects of the present disclosure.

A transmitting device, for example, a user equipment (UE) or a base station, may reduce the peak-to-average power ratio (PAPR) of multiplexed waveforms through crest factor reduction (CFR), or, in particular, successive peak reduction (SPR) CFR. In highly occupied frequency spectrums, SPR CFR may provide for a single-stage reduction of the amplitude of peaks in a transmission signal to conform to a threshold in adjacent channel leakage ratio (ACLR) limited and error vector magnitude (EVM) limited scenarios. By limiting waveform peaks to a defined threshold, SPR CFR may provide for active control of the PAPR of the transmission signal.

A transmitting device may first sample an input signal, dividing the signal into a number of samples across one or more signal windows. In some cases, a length of the signal windows and the number of samples may be determined according to particular bandwidths, sampling rates, and waveforms. In some cases, the window length may be determined based on a resource block (RB) allocation of the input signal. In some cases, the signal windows may be Hanning windows. The device may then determine that the amplitude of a peak of the waveform in one of the samples exceeds a defined threshold, indicating the peak to be reduced. In some cases, a smoothing window may then be applied to the one or more signal windows.

The device may then determine a series of cancellation pulses to be subtracted from the input waveform, for example, in a successive manner, to reduce the amplitude of the peak below the threshold. For example, three separate cancellation pulses may be applied to the wave to reduce and shape the peak. In some cases, the cancellation pulses may be applied in a successive (i.e., recursive) manner. In some cases, SPR CFR may be performed in the envelope domain. Additionally or alternatively, SPR CFR may be performed in the IQ domain to construct a complex signal having component corresponding to a phase and an amplitude. In this case, input IQ samples may be rotated in the frequency domain before SPR CFR to, for example, control the location of clipping noise (i.e., noise shaping), or to minimize peak regrowth. In such cases, after SPR CFR, the device may rotate the signal again in the frequency domain after SPR CFR to correct for the first frequency rotation before SPR CFR. After combining the cancellation pulses with the input waveform, the transceiver may transmit the signal having a reduced PAPR.

In some cases, the described method may be applied to a number of peaks within a particular window. For example, a first series of cancellation pulses may be subtracted from a waveform to reduce a first peak exceeding the defined amplitude threshold, and then a second series of cancellation pulses may be applied to correct for a second peak exceeding the amplitude threshold, and so on. In some cases, after SPR CFR is applied, hard clipping may be applied to remove any peak regrowth.

Aspects of the disclosure are initially described in the context of a wireless communications system. Aspects of the disclosure are further illustrated by and described with reference to apparatus diagrams, system diagrams, and flowcharts that relate to SPR CFR.

FIG. 1 illustrates an example of a wireless communications system 100 in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115.

Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-Universal Terrestrial Radio Access (UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple subcarriers (e.g., using multi-carrier modulation (MCM) techniques such as orthogonal frequency-division multiplexing (OFDM) or discrete Fourier transform-spread-orthogonal frequency-division multiplexing (OFDM) (DFT-s-OFDM)).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some implementations of the techniques described herein, a transmitting device may first sample an input signal, dividing the signal into a number of samples across one or more signal windows. In some cases, a length of the signal windows and the number of samples may be determined according to particular bandwidths, sampling rates, and waveforms. In some cases, the window length may be determined based on a RB allocation of the input signal. In some cases, the signal windows may be Hanning windows. The device may then determine that the amplitude of a peak of the waveform in one of the samples exceeds an defined threshold, indicating the peak to be reduced. In some cases, a smoothing window may then be applied to the one or more signal windows.

The transmitting device may then determine a series of cancellation pulses to be subtracted from the input waveform, for example, in a successive manner, to reduce the amplitude of the peak below the threshold. For example, three separate cancellation pulses may be applied to the wave to reduce and shape the peak. In some cases, the cancellation pulses may be applied in a successive (i.e., recursive) manner. In some cases, SPR CFR may be performed in the envelope domain. Additionally or alternatively, SPR CFR may be performed in the IQ domain to construct a complex signal having a component corresponding to a phase and a component corresponding to an amplitude. In this case, input IQ samples may be rotated in the frequency domain before SPR CFR to, for example, control the location of clipping noise (i.e., noise shaping), or to minimize peak regrowth. In such cases, after SPR CFR, the device may rotate the signal again in the frequency domain after SPR CFR to correct for the first frequency rotation before SPR CFR. After combining the cancellation pulses with the input waveform, the transceiver may transmit the signal having a reduced PAPR.

Figure 2:
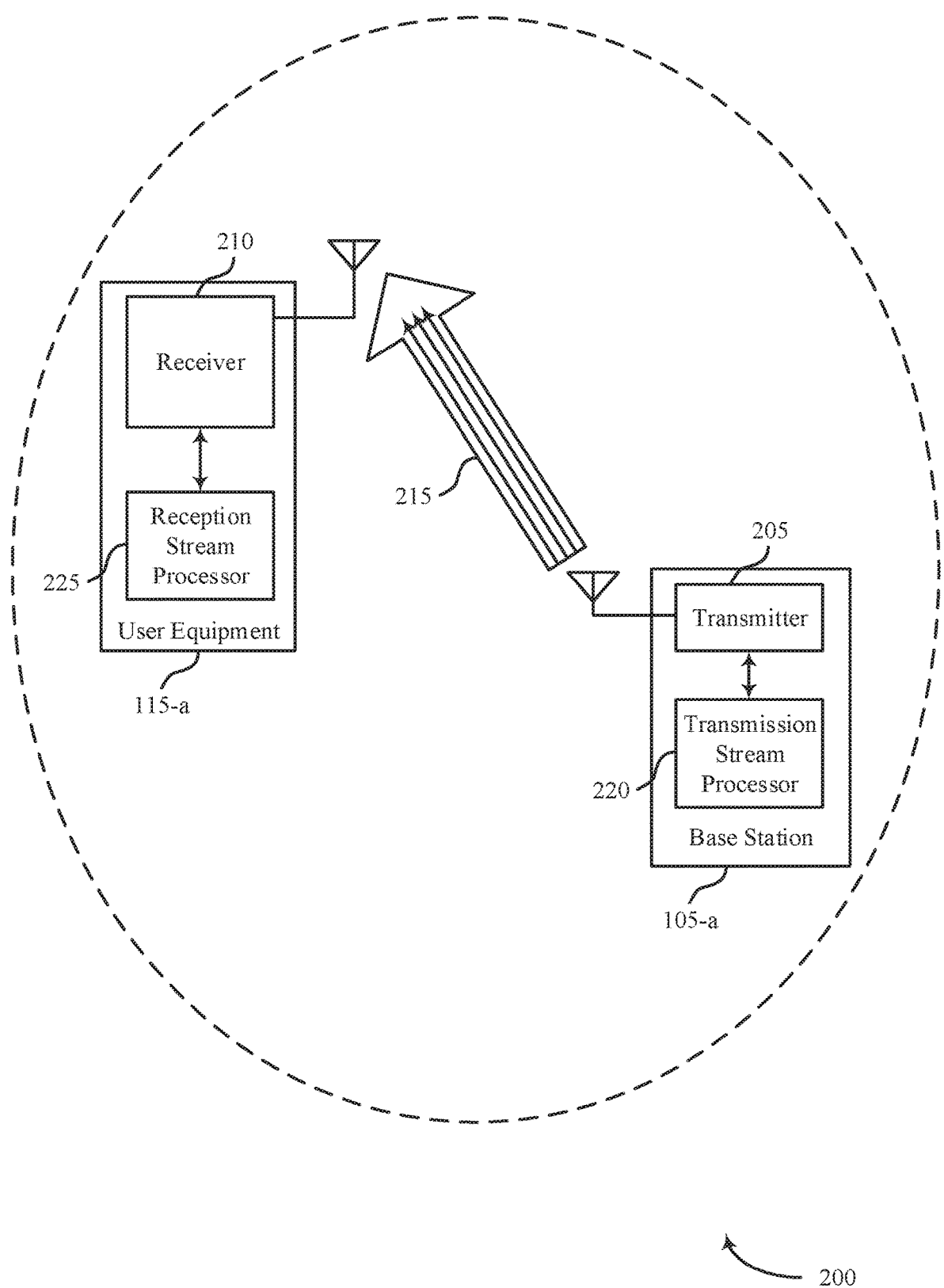
FIG. 2 illustrates an example of a wireless communications system that supports SPR CFR in accordance with aspects of the present disclosure.

FIG. 2 illustrates an example of a wireless communications system 200 that supports SPR CFR in accordance with aspects of the present disclosure. Wireless communications system 200 includes base station 105-*a*, which may be an example of a base station 105 as described with reference to FIG. 1. Wireless communications system 200 also includes UE 115-*a*, which may be an example of a UE 115 as described with reference to FIG. 1. Base station 105-*a* may include a transmitter 205 to transmit signals to UE 115-*a*, and UE 115-*a* may include a receiver 210 to receive signals from base station 105-*a*. The transmitter 205 may communicate with a transmission stream processor 220 to process downlink signals prior to transmission. The receiver 210 may communicate with a reception stream processor 225 to process received downlink signals after reception. Additionally or alternatively, transmitter 205 and transmission stream processor 220 may be located at UE 115-*a*, and receiver 210 and reception stream processor 225 may be located at base station 105-*a*. In this case, transmitter 205 may communicate with transmission stream processor 220 to process uplink or downlink signals prior to transmission, and receiver 210 may communicate with reception stream processor 225 to process the received uplink or downlink signals after reception.

In some cases, base station 105-*a* may identify information for a downlink transmission 215 to UE 115-*a*. For example, base station 105-*a* may identify respective single-carrier streams (e.g., reference signals and data) to be transmitted to UE 115-*a*, and these streams may be multiplexed. In some wireless communications systems, the PAPR (or, the Crest Factor) of single carrier frequency division multiple access (SC-FDMA) or orthogonal frequency division multiple access (OFDMA) transmission may be relatively high. By lowering the PAPR of such a system having a relatively higher overall PAPR, efficiency may be relatively improved. For example, throughput in the wireless communications system 200 may be relatively increased and a talk time of UE 115-*a* receiving downlink transmissions 215 may be relatively extended.

One technique for reducing the PAPR of transmitted multiplexed signals is CFR. Transmission stream processor 220 at a transmitting device may perform CFR in one or more different ways. For example, transmission stream processor 220 may apply, to an input signal, a combination of multi-stage hard clipping and filtering. In some cases, this may include the use of a smart clipper, but, in some cases, a smart clipper may not be able to directly control a target PAPR. In some such cases, an amount of bandwidth occupied for wireless communications may be relatively high (e.g., up to 99%, or more, of the bandwidth). For the such a transmission stream processor 220 with the combination of multi-stage hard clipping and filtering to be utilized in such a highly occupied spectrum, the transmission stream processor 220 may use several sharp filters (that is, requiring many taps) to achieve desired narrowband transmissions. Further, for example, because of various bandwidth to sampling rate ratios for full RB and physical random access channel (PRACH) utilization, several filters may also be needed, as described above. SPR CFR, however, in some cases may have a simpler design without as many filters and/or clippers. As compared to the above-described multi-stage implementation, SPR CFR may provide relatively improved control and associated PAPR and provide a simpler and/or more efficient hardware and software design.

Figure 3:
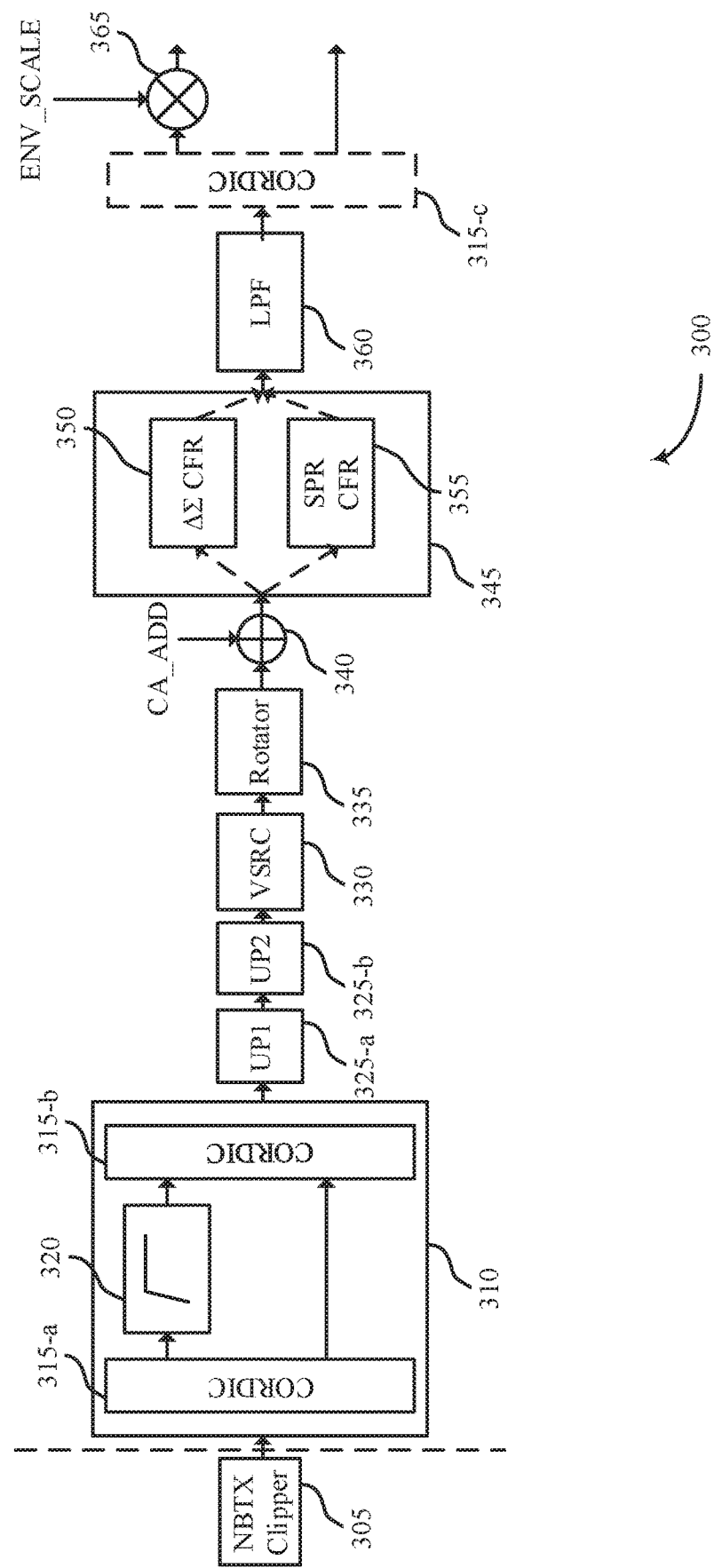
FIG. 3 illustrates an example diagram of a transmission stream processor in accordance with aspects of the present disclosure.

FIG. 3 illustrates an example diagram 300 of a transmission stream processor that supports SPR CFR in accordance with aspects of the present disclosure. The transmission stream processor may perform SPR CFR on one or more waveforms. In some examples, the transmission stream processor may be an example of a transmission stream processor 220 that applies a combination of multi-stage hard clipping and filtering to an input signal, as described with reference to FIG. 2. The transmission stream processor may be at a base station 105, as show with reference to FIG. 2, but may alternatively be located at a UE 115.

A transmitting device, for example, base station 105-*a*, may reduce the PAPR of multiplexed waveforms through CFR, or, in particular, SPR CFR. In highly occupied frequency spectrums, SPR CFR may provide for a single-stage reduction of the amplitude of peaks in a transmission signal to conform to a threshold in ACLR-limited and EVM-limited scenarios. By limiting waveform peaks to a defined threshold, SPR CFR may provide for active control of the PAPR of the transmission signal.

A transmitting device, for example, a base station 105, may first identify information for a downlink transmission to a receiving device, for example, a UE 115. The information may be carried in a signal having a particular waveform. A first stage of signal processing may be applied to the signal at a modem. In the first stage at the modem, clipping may be applied to the waveform to narrow the waveform to a particular frequency band. For example, one or more narrowband transmission (NBTX) clippers 305 may apply an initial stage of clipping to the waveform to narrow the frequency range of the signal to a particular frequency band.

A transceiver may then apply further signal processing to the processed signal having already had clipping applied at NBTX clipper 305. For example, the signal may first pass through front-end clipper 310 (e.g., a TxFE clipper). Front-end clipper 310 may include a first coordinate rotation digital computer (CORDIC) 315-*a*, low-pass filter 320, and a second CORDIC 315-*b*. After passing through front-end clipper 310, one or more filters 325 (e.g., UP1 and UP2 low-pass filters for an upsampling filter) may be applied to the clipped signal. In some cases, a variable sample rate conversion (VSRC) may be applied to the signal at VSRC block 330. In some cases, rotator 335 may then apply a rotation to the signal to move or control the eventual location of clipping noise in the signal. This may provide for noise-shaping capabilities in SPR CFR. The signal may then be processed by adder 340 to combine the signal with one or more component carriers in different radio frequency spectrum bands (e.g., applying a CA_ADD).

Then, according to the techniques described herein, a single-stage CFR may be applied at 345. In some cases, the single-stage CFR at 345 may be a $\Delta\Sigma$ CFR processor 350. Additionally or alternatively, the single-stage CFR at 415 may be performed by a SPR CFR processor 355, which may perform SPR CFR as described, for example, with reference to FIGS. 4 and 5. The signal may then pass through low-pass filter 360. In some cases, for example, if a rotation was applied to the signal by a rotator 335, a further CORDIC 315-*c* may apply a further rotation to the signal (e.g., opposite to the first rotation by the rotator 335). The two combined rotations may accordingly control the location of clipping noise within the processed signal. The CORDIC 315-*c* may also, for example, apply an algorithm to extract one or more components of the signal. For example, one or more CORDICs 315 may extract amplitude and/or phase components from original I/Q components of the signal. A further clipper 365 may apply a final stage of hard clipping to the signal. Clipper 365 may, for example, apply an envelope scale (e.g., ENV_SCALE) clipping the signal, for example, to remove peak regrowth, to finally produce a clipped and filtered waveform within a desired bandwidth and with a relatively reduced PAPR.

The described design may, in the IQ domain, provide for a relatively simpler design with a single-stage clipper, which may be applied at a particular sampling rate. The described SPR CFR techniques may be able to accurately control the PAPR of the signal and provide for little to no PAPR regrowth. In some cases, the SPR CFR techniques may provide for clipping at a relatively higher sampling rate. Further, as compared to, for example, a technique using smoothed peak windows, the SPR CFR design may not use a per-sample division. In some cases, a window length may be selected for the SPR CFR to optimize an ACLR and EVM.

Figure 4:
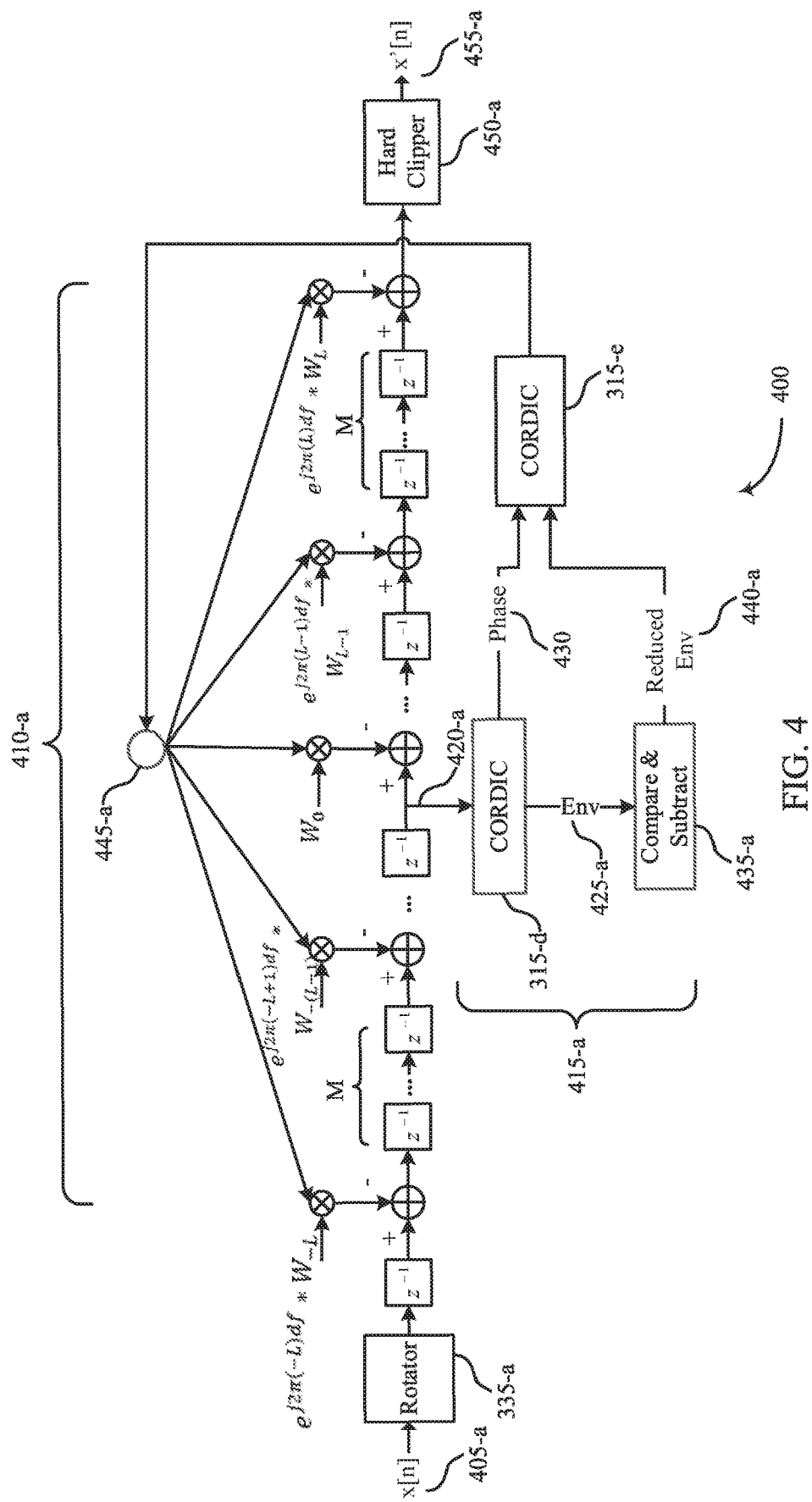
FIGS. 4 and 5 illustrate example diagrams of SPR CFR processors that support SPR CFR in accordance with aspects of the present disclosure.

FIG. 4 illustrates an example diagram 400 of a SPR CFR processor at a transmission stream processor that supports SPR CFR in accordance with aspects of the present disclosure. The transmission stream processor may perform SPR CFR on one or more waveforms. The transmission stream processor may be at a base station 105, as described with reference to FIG. 2, but may alternatively be located at a UE 115. In some examples, the SPR CFR processor may be an example of the SPR CFR processor as described with reference to FIG. 3. FIG. 4 may be an example of a SPR CFR processor in the I/Q domain.

As described herein, a transmitting device, for example, a UE 115 or a base station 105, may reduce the PAPR of multiplexed waveforms through CFR, or, in particular, SPR CFR. In highly occupied frequency spectrums, SPR CFR may provide for a single-stage reduction of the amplitude of peaks in a transmission signal to conform to a threshold in ACLR-limited and EVM-limited scenarios. By limiting waveform peaks to a defined threshold, SPR CFR may provide for active control of the PAPR of the transmission signal.

The SPR CFR processor may process input signal 405-*a* to reduce the PAPR of its waveform. Input signal 405-*a* may be a complex signal with envelope and phase components represented by x(n). In some cases, input signal 405-a may first be inputted into rotator 335-a. Rotator 335-a may be an example of the rotator 33 as described with reference to FIG. 3. Rotator 335-a may apply a rotation (i.e., a frequency domain offset) to the signal to move or control the eventual location of clipping noise in the signal and/or to minimize peak regrowth after the SPR CFR procedure. The SPR CFR processor may sample input signal 405-a. This may include dividing the signal into a number of samples across signal window 410-a. That is, by sampling input signal 405-a, one or more signal windows 410-a may be obtained, where each signal window 410-a may include one or more sample (e.g., sample points). A segment of the signal window 410-a may include a number M samples, as shown in FIG. 4. A length of signal window 410-a, and the number of samples to be taken within signal window 410-a, may be determined according to particular bandwidths, sampling rates, RB allocation, and waveforms of input signal 405-a. As shown in FIG. 4, the signal window 410-a has a length of 2L+1.

The SPR CFR processor may be tapped out, for example, at a certain tap delay. In some cases, the tap may be at a halfway point, as shown at 420-a in FIG. 4. Alternatively, the tap may be at an earlier or later point in the processing timeline. After the tap at 420-a, the signal may by processed through feedback loop 415-a. Feedback loop 415-a may include a first CORDIC 315-d. In some cases, CORDIC 315-d may be a CORDIC R2P, which may extract phase component 430 and envelope component 425-a from original complex I/Q components of the signal. Alternatively, in place of the CORDIC R2P, a table-lookup function may be used to extract phase component 430 and envelope component 425-a.

At 435-a, the SPR CFR processor may compare the input envelope component 425-a of the signal at the particular sample point to an amplitude threshold to determine whether the amplitude of the sample point exceeds that of the amplitude threshold. In some cases, this sample point may be a local peak of the waveform of the signal, but the sample need not be the local peak of the waveform. That is, the sample point may be any point along the waveform. If the SPR CFR processor determines that the amplitude at the sample point exceeds the threshold, the SPR CFR may determine and subtract a series of cancellation pulses from the waveform to obtain a reduced signal with reduced envelope component 440-a, according to the following equation:

$$\begin{cases} n[n] - A, & \text{if } x[n] > A \\ 0, & \text{if } x[n] \leq A \end{cases}$$

where, for each iteration of t, the following equation is applied:

$$x_{n-k}(t+1) = x_{n-k}(t) - \frac{(|x_n| - A)x_n}{|x_n|} W_k e^{j2\pi k df}, k = -L:L.$$

Here, df may represent the frequency offset (i.e., a rotation) to be applied at the corresponding point along the signal. For example, at the center tap (k=0) shown at $W_0$, k*df=0. At a second tap (k=1), for example, the tap shown at $W_1$, a rotation of k*df=δ may be applied (and, correspondingly, a rotation of df=−δ at $W_{-1}$). At a third tap, for example, the tap shown at $W_2$, a rotation of df=2δ may be applied (and, correspondingly, a rotation of df=−2δ at $W_{-2}$). These rotations may be applied at each tap to correct for the first rotation at the rotator 335-a.

The series of cancellation pulses may be determined to reduce the amplitude, and accordingly the PAPR, of the waveform. The series of cancellation pulses may use a Hanning window, or another pulse shape (e.g., of one or more complex pulses) to control the clipping noise distribution. That is, the input signal may be reduced by a series of cancellation pulses including one or more Hanning windows. In some cases, a length of the Hanning window and the number of samples within the Hanning window may the same as that of the input signal 405-a. For example, for windows W(−L:L), the length of a Hanning window may be 2L+1, corresponding to the length of the signal window 410-a. As shown in FIG. 4, the cancellation pulse may be tapped at one or more tap delay lines, as shown at $W_{-L}$ to $W_L$. That is the value of W at each of $W_{-L}$ to $W_L$ may be a scalar corresponding to an amplitude of the cancellation pulse to be subtracted from the signal at that point. In some cases, the SPR CFR processor may then apply a smoothing window to the sample windows. A length of the smoothing window may be determined similarly as the signal window 410-a and the Hanning window. For example, the length of each of the signal window 410-a, the Hanning window, and the smoothing window may be a same length.

The cancellation pulse may be, for example, a complex rotated Hanning window or other shape. Reduced envelope component 440-a may be recombined with phase component 430 via a second CORDIC 315, for example CORDIC 315-e (e.g., a CORDIC P2R), to obtain a reduced signal with the same phase of the signal at 420-a. The reduced signal may then be fed back to the taps at 445-a, where the reduced signal may be sampled again, and a new sample may be chosen, compared against the threshold, and similarly run through feedback loop 415-a to be reduced if the new sample exceeds the amplitude threshold. That is, after a first cancellation (e.g., using a first Hanning window) is applied and subtracted from the signal to obtain a reduced signal, the reduced signal may be sampled again to determine a second cancellation pulse (e.g., using a second Hanning window) to be subtracted from the reduced signal, and so on. This recursive process may be repeated any number of times until a number of samples at different points are each below the amplitude threshold.

For example, in a first clock cycle, a tap at the halfway point of the signal window 420-a (i.e., a center tap shown here at $W_0$) may correspond to a point at which the cancellation pulse is phase-aligned to the sample within the signal window 410-a. At this center point, the cancellation pulse may match the amount the sample exceeds the amplitude threshold. Thus, after subtracting the cancellation pulse from the signal, the amplitude of the threshold may directly match the amplitude threshold. Then, at a second clock cycle, moving outwards from the center point, samples stored each of the chain of registers (shown as the $z^{-1}$ blocks in FIG. 4) may similarly be reduced by the value of W at the corresponding point of the cancellation pulse. After the first reduction in the first clock cycle, a sample adjacent to the center tap may be aligned with the center tap and a further cancellation pulse determined from the now-reduced signal, which may then be subtracted from the already-reduced signal.

In some cases, one or more hard clippers 450-a may apply hard clipping to the processed and accordingly reduced signal. This may, for example, remove any peak regrowth that may have occurred in the SPR CFR procedure. In some cases, for example, if a rotation was applied to the signal by the rotator 335-*a*, a further rotation (e.g., in the frequency domain) may be applied to the signal or to the series of cancellation pulses to correct for the first rotation at the rotator 335-*a*. In some cases, the cancellation pulse may be rotated to achieve the same effect. As described above, the rotation of one or more cancellation pulses may be different from one signal window to another to distribute cancellation noise. Additionally or alternatively, for example, a further CORDIC 315 may apply a further rotation to correct for the first rotation at the rotator 335-*a* (e.g., if a further rotation was not at the cancellation pulses). In some cases, different peaks of input signal 405-*a* may have different phases, and through the first and second applied rotations, the described noise shaping may be achieved. This may, for example, facilitate detection of SEM corners. In some cases, unsymmetrical spectrum shaping may be used. After combining the cancellation pulses with the input signal 405-*a* to obtain a reduced signal, the transceiver may transmit the complex output signal 455-*a* in the I/Q domain having an accordingly reduced PAPR.

In some cases, the described techniques may be applied to more than one peak (that is, any number of peaks) within a particular window. For example, a first series of cancellation pulses may be subtracted from a waveform to reduce a first peak exceeding the defined amplitude threshold, and then a second series of cancellation pulses may be applied to correct for a second peak exceeding the amplitude threshold, and so on, where each series of cancellation pulses may be determined as described above.

A receiving device, for example, at the reception stream processor 225 at the UE 115 as described with reference to FIG. 2, may detect peaks of the received signal. The SPR CFR procedure may generate a unique clipping pattern on reduced peaks of the signal such that the receiving device may identify the peaks by identifying the unique clipping pattern. For example, the reception stream processor may detect a first peak and a second peak of the reduced signal based on a pattern of the respective first and second peaks. In some cases, the pattern of the first and second peaks may be the same. The pattern of the first peak and the second peak may be based on the combined series of cancellation pulses as described above. The receiving device may then decode the reduced signal based on the detected peaks.

Figure 5:
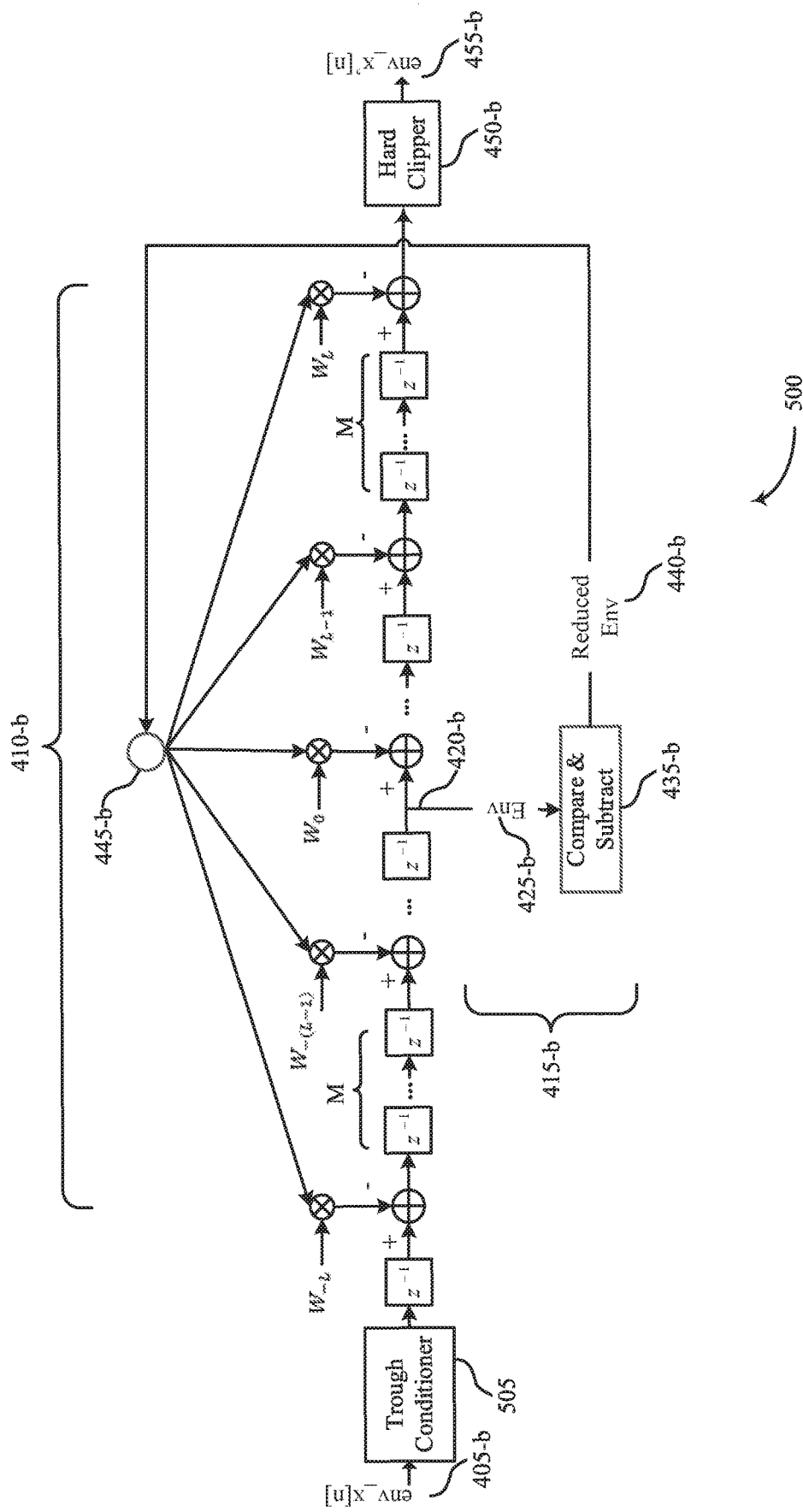

FIG. 5 illustrates an example diagram 500 of a SPR CFR processor at a transmission stream processor that supports SPR CFR in accordance with aspects of the present disclosure. The transmission stream processor may perform SPR CFR on one or more waveforms. The transmission stream processor may be at a base station 105, as show with reference to FIG. 2, but may alternatively be located at a UE 115. In some examples, the SPR CFR processor may be an example of the SPR CFR processor as described with reference to FIG. 3. FIG. 5 may be an example of a SPR CFR processor in the envelope domain.

The SPR CFR processor of FIG. 5 may determine a series of cancellation pulses to be subtracted from input signal 405-*b* to reduce the amplitude of the peak below the amplitude threshold in a recursive manner as similarly described with reference to FIG. 4. In the case of FIG. 5, only envelope component 425-*b* of input signal 405-*b* may be considered and used, and envelope component 425-*b* may not be separated from a phase domain component (or a component in another domain) in feedback loop 415-*b*. Accordingly, in these cases, a phase rotation may not be applied at the taps, as shown in FIG. 5.

That is, at 420-*b*, the SPR CFR processor may compare the input envelope component 425-*b* of the signal at the sample point to an amplitude threshold, and if the envelope component 425-*b* exceeds the amplitude threshold, subtract the series of cancellation pulses to obtain a reduced signal with reduced envelope component 440-*b*, as similarly described with reference to FIG. 4. In some cases, the SPR CFR processor of FIG. 5 in the envelope domain may include trough conditioner 505. The trough conditioner may modulate or increase troughs of the waveform to ensure that, after canceling, there are no negative peak values in the waveform. After combining the cancellation pulses with the input signal 405-*b* in a similar manner as described above, the transceiver may transmit the output signal 455-*b* in the envelope domain having an accordingly reduced PAPR.

Figure 6:
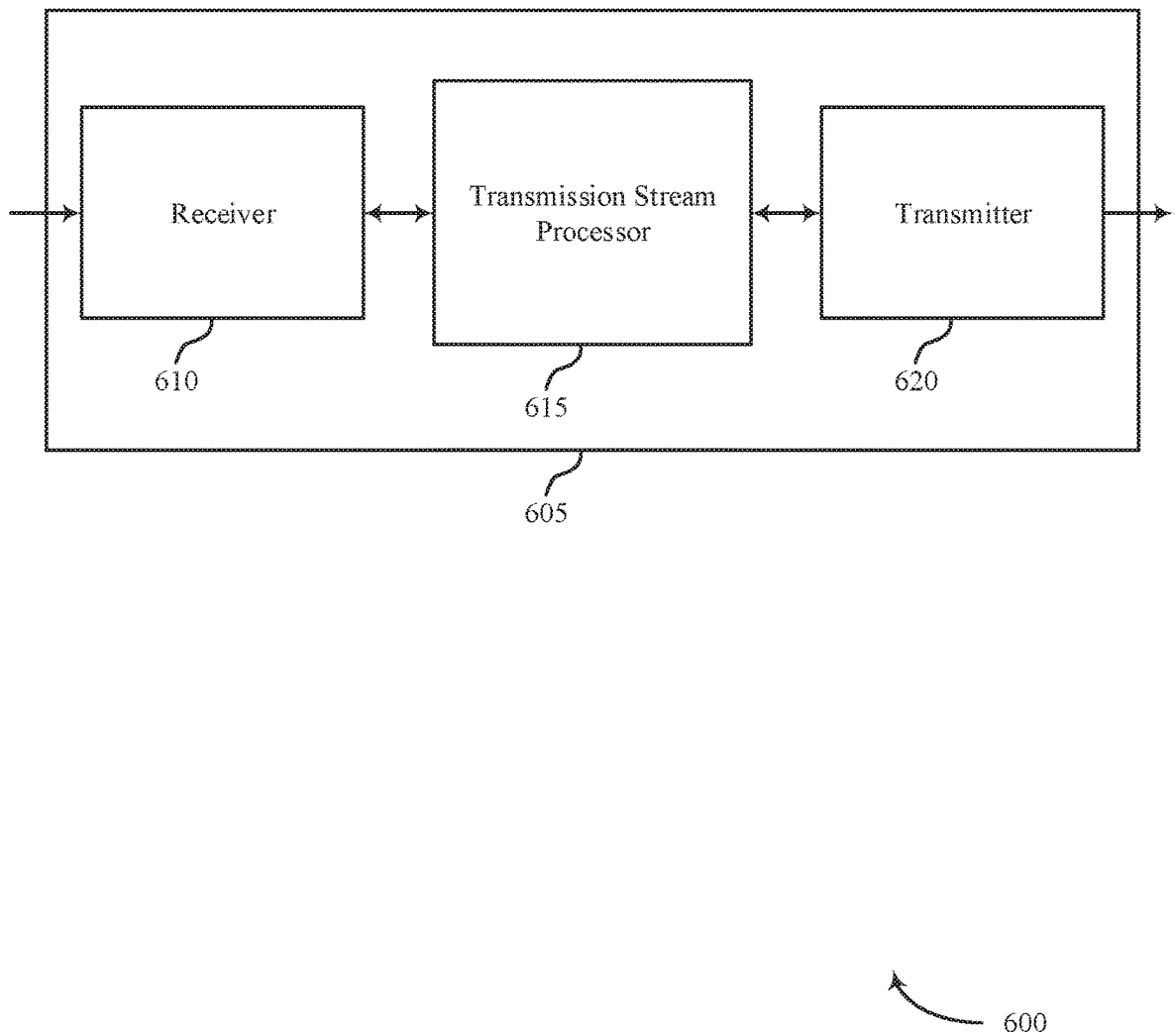
FIGS. 6 and 7 show block diagrams of wireless devices that support SPR CFR in accordance with aspects of the present disclosure.

FIG. 6 shows a block diagram 600 of a wireless device 605 that supports SPR CFR in accordance with aspects of the present disclosure. In some cases, wireless device 605 may be an example of aspects of a transmitting device as described herein. In some cases, the transmitting device may be a base station 105, but may alternatively be a UE 115. Wireless device 605 may include receiver 610, transmission stream processor 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to SPR CFR, etc.). Information may be passed on to other components of the device. The receiver 610 may be an example of aspects of the transceiver 935 described with reference to FIG. 9. The receiver 610 may utilize a single antenna or a set of antennas.

Transmission stream processor 615 may be an example of aspects of the transmission stream processors described with reference to FIGS. 2 through 5 and 7 through 9.

Transmission stream processor 615 and/or at least some of its various sub-components may be implemented in hardware, software executed by a processor, firmware, or any combination thereof. If implemented in software executed by a processor, the functions of the transmission stream processor 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The transmission stream processor 615 and/or at least some of its various sub-components may be physically located at various positions, including being distributed such that portions of functions are implemented at different physical locations by one or more physical devices. In some examples, transmission stream processor 615 and/or at least some of its various sub-components may be a separate and distinct component in accordance with various aspects of the present disclosure. In other examples, transmission stream processor 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Transmission stream processor 615 may sample an input signal to obtain one or more signal windows. Transmission stream processor 615 may determine that an amplitude of a first sample within a first signal window of the one or more signal windows exceeds an amplitude threshold. Transmission stream processor 615 may combine a series of cancellation pulses with the first sample within the first signal window to obtain a reduced signal, where the reduced signal may include one or more reduced samples with amplitudes within the amplitude threshold. In some cases, the series of cancellation pulses may be based on a characteristic of the first sample. Transmission stream processor 615 may transmit the reduced signal.

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
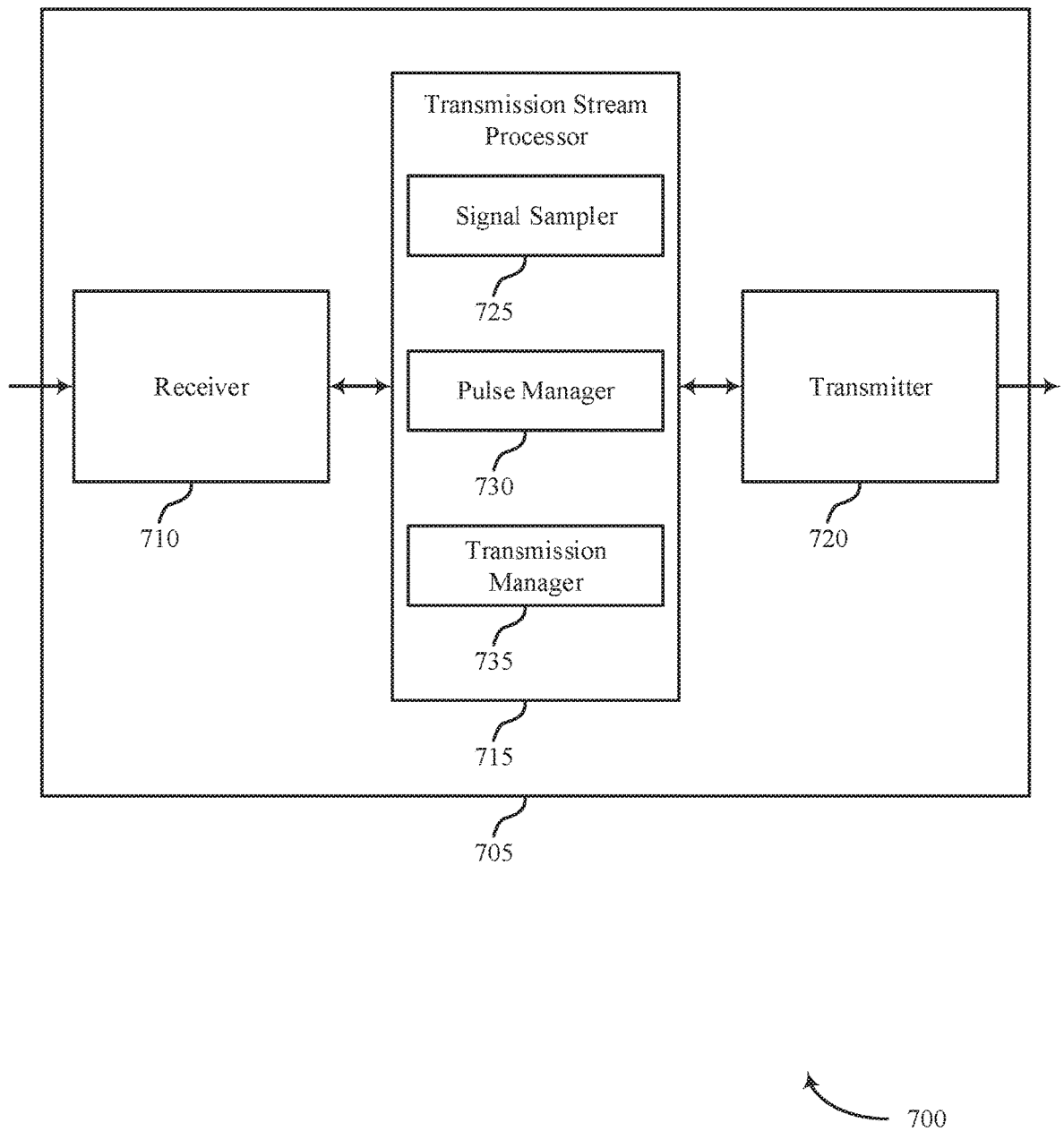

FIG. 7 shows a block diagram 700 of a wireless device 705 that supports SPR CFR in accordance with aspects of the present disclosure. Wireless device 705 may be an example of aspects of a transmitting device as described herein. In some cases, the transmitting device may be a base station 105, but may alternatively be a UE 115. Wireless device 705 may include receiver 710, transmission stream processor 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to SPR CFR, etc.). Information may be passed on to other components of the device. The receiver 710 may be an example of aspects of the transceiver 935 described with reference to FIG. 9. The receiver 710 may utilize a single antenna or a set of antennas.

Transmission stream processor 715 may be an example of aspects of the transmission stream processors described with reference to FIGS. 2 through 6 and 8 through 9. Transmission stream processor 715 may include signal sampler 725, pulse manager 730, and transmission manager 735.

Signal sampler 725 may sample an input signal to obtain one or more signal windows and determine a length of the one or more signal windows, for example, based on a bandwidth of the input signal, a sampling rate of the input signal, a RB allocation of the input signal, or a combination thereof. In some cases, the series of cancellation pulses may be based at least in part on a Hanning window, where the length of the Hanning window may be the same as the length of a signal window of the one or more signal windows. In some cases, sampling the input signal may include applying a smoothing window to the one or more Hanning windows. In some cases, a length of the smoothing window may be similarly determined based on an available bandwidth for the input signal, a sampling rate, a waveform of the input signal, a RB allocation of the input signal, or a combination thereof.

Pulse manager 730 may determine that an amplitude of a first sample within a first signal window of the one or more signal windows exceeds an amplitude threshold. Pulse manager 730 may combine a series of cancellation pulses with the first sample within the first signal window to obtain a reduced signal, where the reduced signal may include one or more reduced samples with amplitudes within the amplitude threshold. The series of cancellation pulses may be based on a characteristic of the first sample. In some cases, the characteristic of the first sample may include an envelope of the first sample. In some cases, the series of cancellation pulses may be based on a phase of the first sample and a phase of the second sample, where the phase of the first sample and the phase of the second sample may be different.

Pulse manager 730 may determine that an amplitude of a second sample within a second signal window of the one or more signal windows of the reduced signal exceeds the amplitude threshold, where the series of cancellation pulses may be based on an characteristic of the second sample. In some cases, pulse manager 730 may further determine that an amplitude of a third sample within a third signal window of the one or more signal windows exceeds the amplitude threshold, where the series of cancellation pulses may be based on an envelope of the third sample. In some cases, the series of cancellation pulses may be based on a phase of the first sample. In some cases, the series of cancellation pulses may include a first cancellation pulse and a second cancellation pulse, where the envelope of the second sample is based on the first cancellation pulse, and the second cancellation pulse is based on the envelope of the second sample. In some cases, the series of cancellation pulses may include a recursive series of cancellation pulses. In some cases, an amplitude of the one or more reduced samples of the reduced signal may be less than the amplitude threshold.

Transmission manager 735 may transmit the reduced signal, for example, via transmitter 720. Transmitter 720 may transmit signals generated by other components of the device. In some examples, the transmitter 720 may be collocated with a receiver 710 in a transceiver module. For example, the transmitter 720 may be an example of aspects of the transceiver 935 as described with reference to FIG. 9. The transmitter 720 may utilize a single antenna or a set of antennas.

Figure 8:
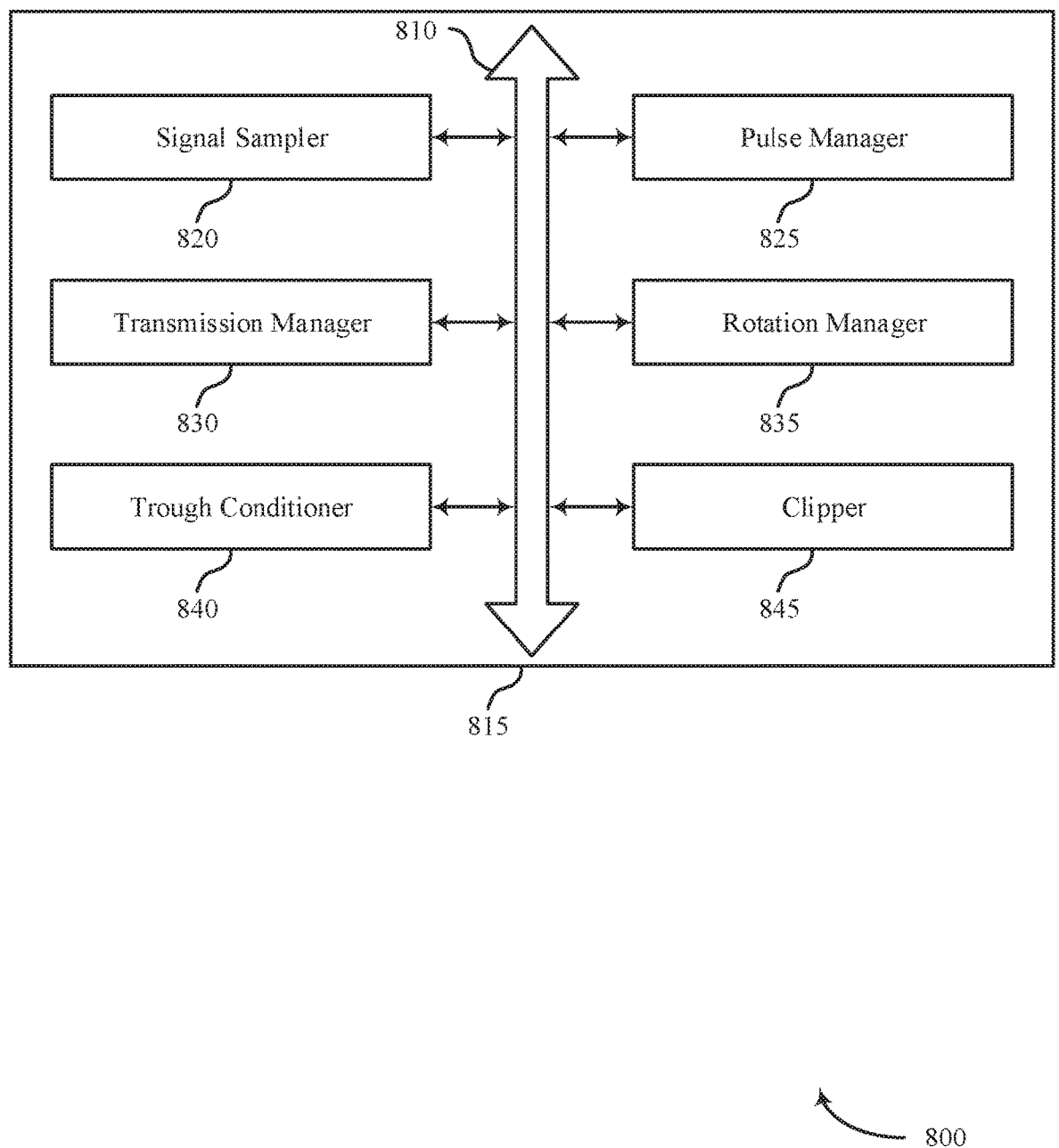
FIG. 8 shows a block diagram of a transmission stream processor that supports SPR CFR in accordance with aspects of the present disclosure.

FIG. 8 shows a block diagram 800 of a transmission stream processor 815 that supports SPR CFR in accordance with aspects of the present disclosure. The transmission stream processor 815 may be an example of aspects of a transmission stream processor as described with reference to FIGS. 2 through 7. The transmission stream processor 815 may include signal sampler 820, pulse manager 825, transmission manager 830, rotation manager 835, trough conditioner 840, and clipper 845. Each of these modules may communicate, directly or indirectly, with one another (e.g., via one or more buses 810).

Signal sampler 820 may sample an input signal to obtain one or more signal windows and determine a length of the one or more signal windows, for example, based on a bandwidth of the input signal, a sampling rate of the input signal, a RB allocation of the input signal, or a combination thereof. In some cases, the series of cancellation pulses may be based at least in part on a Hanning window, where the length of the Hanning window may be the same as the length of a signal window of the one or more signal windows. In some cases, sampling the input signal may include applying a smoothing window to the one or more Hanning windows. In some cases, a length of the smoothing window may be similarly determined based on an available bandwidth for the input signal, a sampling rate, a waveform of the input signal, a RB allocation of the input signal, or a combination thereof.

Pulse manager 825 may determine that an amplitude of a first sample within a first signal window of the one or more signal windows exceeds an amplitude threshold. Pulse manager 825 may combine a series of cancellation pulses with the first sample within the first signal window to obtain a reduced signal, where the reduced signal may include one or more reduced samples with amplitudes within the amplitude threshold. In some cases, the series of cancellation pulses may be based on a characteristic of the first sample. In some cases, the characteristic of the first sample may include an envelope of the first sample. In some cases, the series of cancellation pulses may be based on a phase of the first sample and a phase of the second sample, where the phase of the first sample and the phase of the second sample may be different.

Pulse manager 825 may determine that an amplitude of a second sample within a second signal window of the one or more signal windows of the reduced signal exceeds the amplitude threshold, where the series of cancellation pulses is based on an characteristic of the second sample. Pulse manager 825 may determine that an amplitude of a third sample within a third signal window of the one or more signal windows exceeds the amplitude threshold, where the series of cancellation pulses may be based on an envelope of the third sample. In some cases, the series of cancellation pulses may be based on a phase of the first sample. In some cases, the series of cancellation pulses may include a first cancellation pulse and a second cancellation pulse, where the envelope of the second sample may be based on the first cancellation pulse, and the second cancellation pulse may be based on the envelope of the second sample. In some cases, the series of cancellation pulses may include a recursive series of cancellation pulses. In some cases, an amplitude of the one or more reduced samples of the reduced signal may be less than the amplitude threshold.

Transmission manager 830 may transmit the reduced signal. In some cases, before transmission manager 830 transmits the reduced signal, rotation manager 835 may apply a frequency domain rotation to the series of cancellation pulses within the first signal window to obtain a series of frequency shifted cancellation pulses, where the series of frequency shifted cancellation pulses may be frequency shifted relative to the input signal. Combining the series of cancellation pulses with the first sample may include combining the series of frequency shifted cancellation pulses with the first sample. In some cases, rotation manager 835 may further apply a second frequency domain rotation to the series of cancellation pulses within a second signal window. In some cases, the second frequency domain rotation may be different than the first frequency domain rotation, and the first frequency domain rotation and the second frequency domain rotation may be applied to distribute noise cancellation. Additionally or alternatively, before transmission manager 830 transmits the reduced signal, rotation manager 835 may apply a first frequency domain rotation to the input signal to obtain a rotated input signal including the first sample. In some cases, rotation manager 835 may further apply a second frequency domain rotation to the reduced signal. In some cases, the second frequency domain rotation may be different than the first frequency domain rotation. In some cases, before transmission manager 830 transmits the reduced signal, trough conditioner 840 may apply a trough conditioner 840 to the input signal. In some cases, before transmission manager 830 transmits the reduced signal, transmission manager 830 may process the reduced signal with a filter to obtain a filtered reduced signal. In some cases, before transmission manager 830 transmits the reduced signal, clipper 845 may apply hard clipping to the filtered reduced signal to obtain an output signal to transmit the reduced signal.

Figure 9:
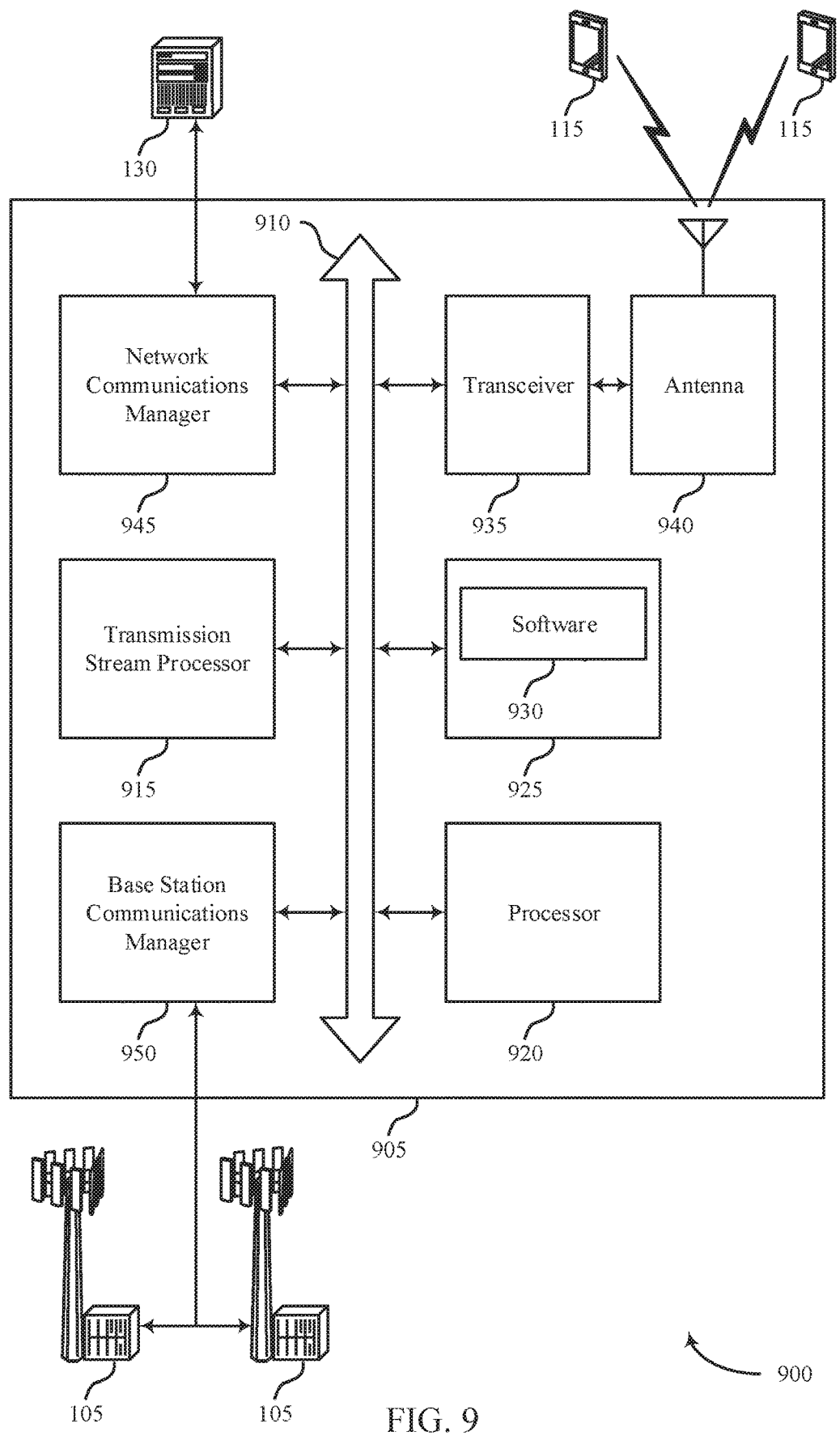
FIG. 9 illustrates a block diagram of a system including a device that supports SPR CFR in accordance with aspects of the present disclosure.

FIG. 9 illustrates a block diagram of a system 900 including a device 905 that supports SPR CFR in accordance with aspects of the present disclosure. Device 905 may be an example of or include the components of a base station as described with reference to FIGS. 1 and 2. Device 905 may include components for bi-directional voice and data communications including components for transmitting and receiving communications, including transmission stream processor 915, processor 920, memory 925, software 930, transceiver 935, antenna 940, network communications manager 945, and base station communications manager 950. These components may be in electronic communication via one or more busses (e.g., bus 910). Device 905 may communicate wirelessly with one or more UEs 115. Specifically, transmission stream processor 915 may include components corresponding to the functions of a transmission stream processor as described with reference to FIGS. 2 through 9. Although illustrated as implemented in a device 905 including the components of a base station 105, a transmission stream processor 915 may be implemented in any wireless communications device such as an access point, repeater, relay station, or UE 115.

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting frequency and time domain multiplexing for low PAPR waveform design with multiple streams).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware and/or software operation such as the interaction with peripheral components or devices.

Software 930 may include code to implement aspects of the present disclosure, including code to support frequency and time domain multiplexing for low PAPR waveform design with multiple streams. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may coordinate with a transmission stream processor 915 to process signals for uplink transmission. For example, transmission stream processor 915 may include aspects of transmission stream processors as described with reference to FIGS. 2 through 8. In some cases, transmission stream processor 915 may sample an input signal to obtain one or more signal windows, determine that an amplitude of a first sample within a first signal window of the one or more signal windows exceeds an amplitude threshold, combine a series of cancellation pulses with the first sample within the first signal window to obtain a reduced signal, the reduced signal comprising one or more reduced samples with amplitudes within the amplitude threshold, the series of cancellation pulses based at least in part on a characteristic of the first sample, and transmit the reduced signal.

In some cases, the characteristic of the first sample may include an envelope of the first sample. In some cases, the series of cancellation pulses may be based on a phase of the first sample. In some cases, transmission stream processor 915 may determine that an amplitude of a second sample within a second signal window of the one or more signal windows of the reduced signal exceeds the amplitude threshold, where the series of cancellation pulses may be based on an characteristic of the second sample.

In some cases, the series of cancellation pulses may include a first cancellation pulse and a cancellation second pulse, the envelope of the second sample may be based on the first cancellation pulse, and the second cancellation pulse may be based on the envelope of the second sample. In some cases, the series of cancellation pulses may be based on a phase of the first sample and a phase of the second sample, where the phase of the first sample and the phase of the second sample may be different.

In some cases, transmission stream processor 915 may determine that an amplitude of a third sample within a third signal window of the one or more signal windows exceeds the amplitude threshold, where the series of cancellation pulses may be based on an envelope of the third sample. In some cases, the series of cancellation pulses may include a recursive series of cancellation pulses. In some cases, an amplitude of the one or more reduced samples of the reduced signal may be less than the amplitude threshold. In some cases, transmission stream processor 915 may apply a frequency domain rotation to the series of cancellation pulses within the first signal window to obtain a series of frequency shifted cancellation pulses, where the series of frequency shifted cancellation pulses may be frequency shifted relative to the input signal. Combining the series of cancellation pulses with the first sample may include combining the series of frequency shifted cancellation pulses with the first sample. Additionally or alternatively, transmission stream processor 915 may apply a first frequency domain rotation to the input signal to obtain a rotated input signal including the first sample.

In some cases, transmission stream processor 915 may apply a second frequency domain rotation to the series of cancellation pulses within a second signal window. In some cases, the second frequency domain rotation may be different than the first frequency domain rotation, and the first frequency domain rotation and the second frequency domain rotation may be applied to distribute noise cancellation. Additionally or alternatively, transmission stream processor 915 may apply a second frequency domain rotation to the reduced signal. In some cases, the second frequency domain rotation may be different than the first frequency domain rotation. In some cases, transmission stream processor 915 may determine a length of the one or more signal windows, for example, based on a bandwidth of the input signal, a sampling rate of the input signal, a RB allocation of the input signal, or a combination thereof. In some cases, the series of cancellation pulses may be based at least in part on a Hanning window, where the length of the Hanning window may be the same as the length of a signal window of the one or more signal windows. In some cases, the sampling the input signal may include applying a smoothing window to the one or more Hanning windows. In some cases, a length of the smoothing window may be similarly determined based on an available bandwidth for the input signal, a sampling rate, a waveform of the input signal, a RB allocation of the input signal, or a combination thereof.

In some cases, transmission stream processor 915 may apply a trough conditioner to the input signal. In some cases, transmission stream processor 915 may apply hard clipping to the reduced signal.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may include components such as digital-to-analog or analog-to-digital converters, downconverters, upconverters, filters, etc. In some cases, the wireless device may include a single antenna 940. However, in some cases the device may have more than one antenna 940, which may be capable of concurrently transmitting or receiving multiple wireless transmissions.

Network communications manager 945 may manage communications with the core network (e.g., via one or more wired backhaul links). For example, the network communications manager 945 may manage the transfer of data communications for client devices, such as one or more UEs 115.

Base station communications manager 950 may manage communications with other base station 105, and may include a controller or scheduler for controlling communications with UEs 115 in cooperation with other base stations 105. For example, the base station communications manager 950 may coordinate scheduling for transmissions to UEs 115 for various interference mitigation techniques such as beamforming or joint transmission. In some examples, base station communications manager 950 may provide an X2 interface within an LTE/LTE-A wireless communications network technology to provide communication between base stations 105.

Figure 10:
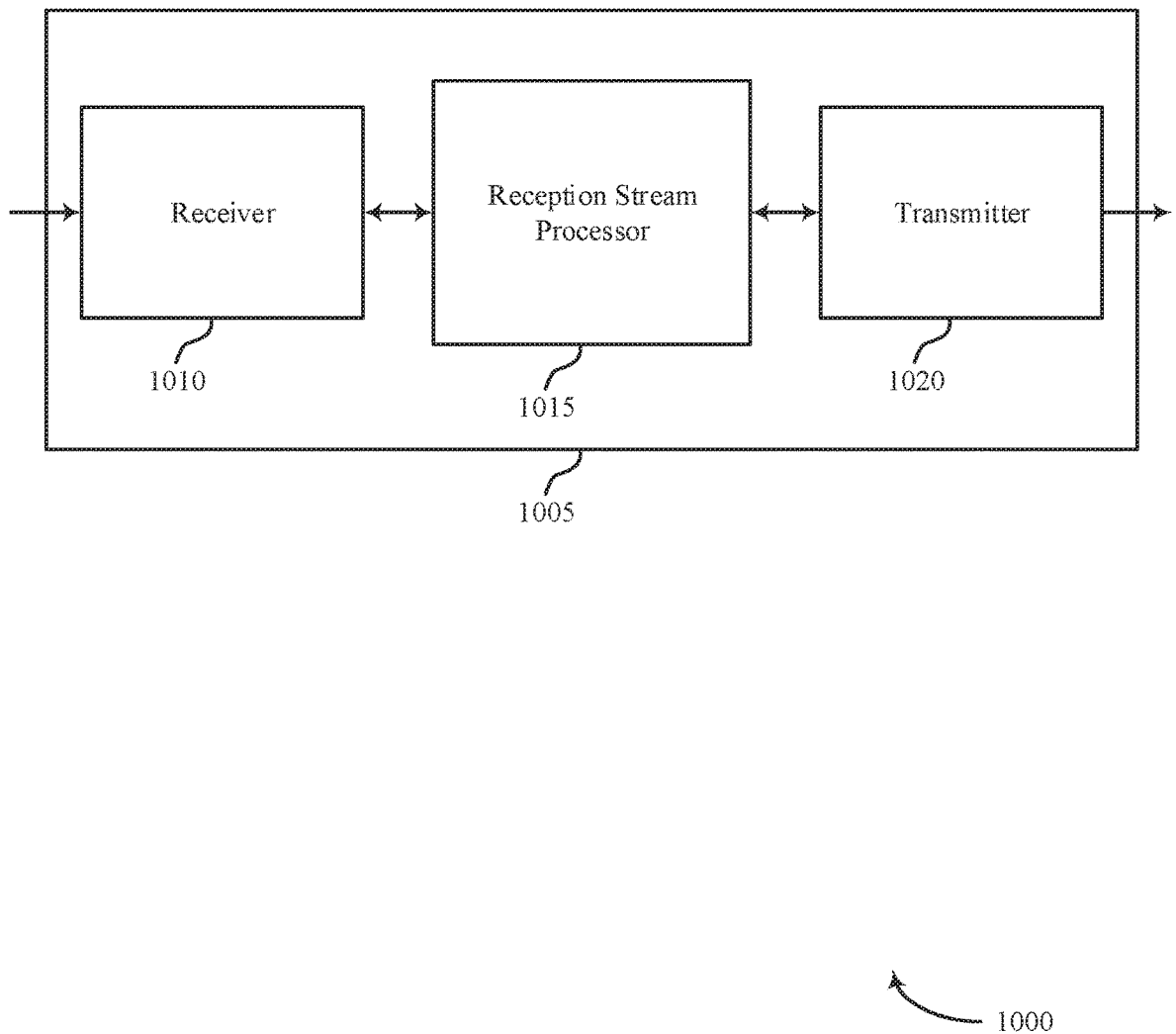
FIGS. 10 and 11 show block diagrams of wireless devices that support SPR CFR in accordance with aspects of the present disclosure.

FIG. 10 shows a block diagram 1000 of a wireless device 1005 that supports SPR CFR in accordance with aspects of the present disclosure. Wireless device 1005 may be an example of aspects of a receiving device as described herein. In some cases, the receiving device may be a UE 115, but may alternatively be a base station 105. Wireless device 1005 may include receiver 1010, reception stream processor 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to SPR CFR, etc.). Information may be passed on to other components of the device. The receiver 1010 may be an example of aspects of the transceiver 1335 described with reference to FIG. 13. The receiver 1010 may utilize a single antenna or a set of antennas.

Reception stream processor 1015 may be an example of aspects of the reception stream processors described with reference to FIGS. 2 through 5.

Reception stream processor 1015 and/or at least some of its various sub-components may be implemented in hardware, software executed by a processor, firmware, or any combination thereof. If implemented in software executed by a processor, the functions of the reception stream processor 1015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The reception stream processor 1015 and/or at least some of its various sub-components may be physically located at various positions, including being distributed such that portions of functions are implemented at different physical locations by one or more physical devices. In some examples, reception stream processor 1015 and/or at least some of its various sub-components may be a separate and distinct component in accordance with various aspects of the present disclosure. In other examples, reception stream processor 1015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Reception stream processor 1015 may receive a reduced signal. In some cases, reception stream processor 1015 may detect a first peak of the reduced signal based on a pattern of the first peak, where the pattern of the first peak based on a combined series of cancellation pulses. Reception stream processor 1015 may decode the reduced signal based on detecting the first peak.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1335 described with reference to FIG. 13. The transmitter 1020 may utilize a single antenna or a set of antennas.

Figure 11:
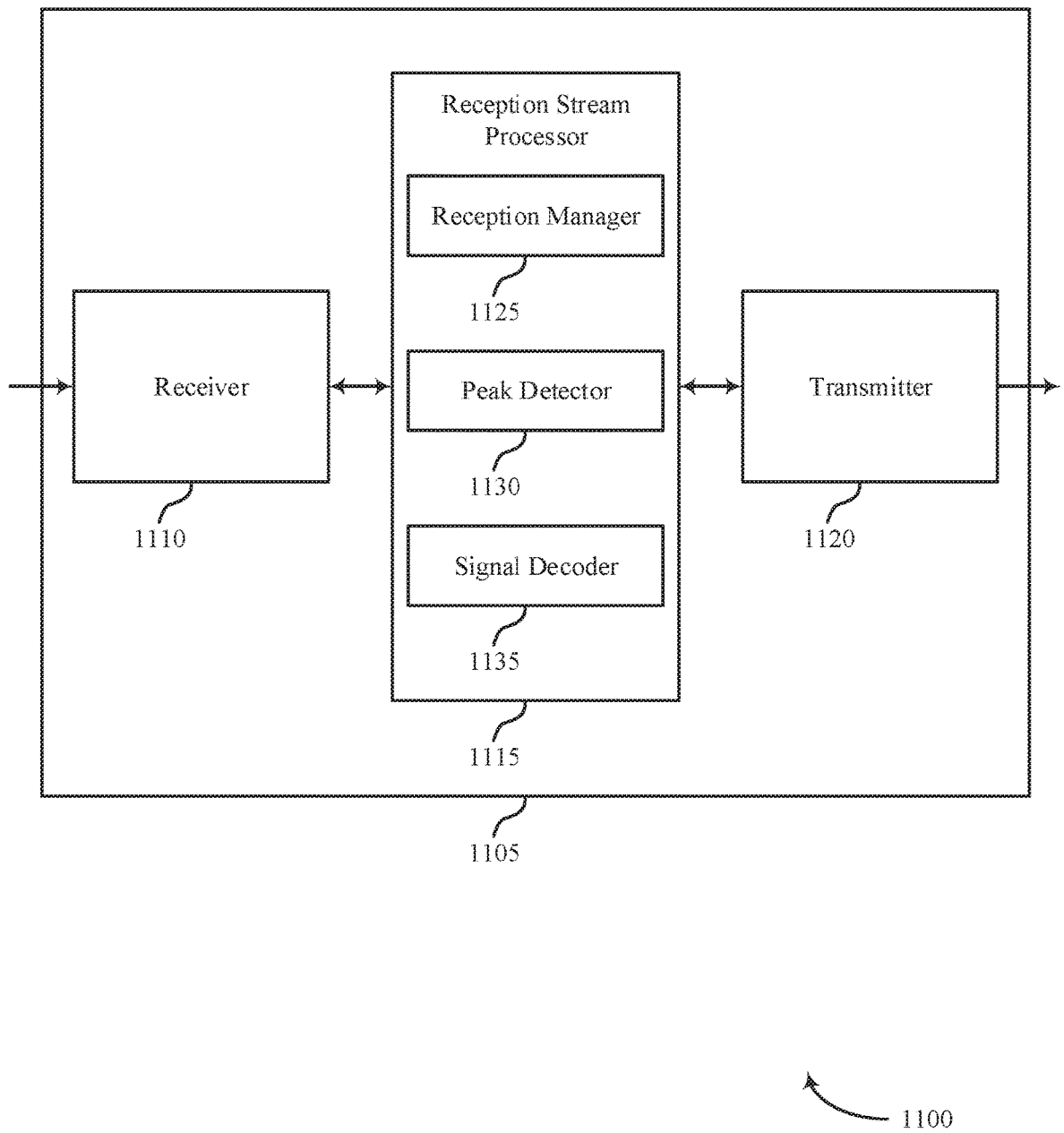

FIG. 11 shows a block diagram 1100 of a wireless device 1105 that supports SPR CFR in accordance with aspects of the present disclosure. Wireless device 1105 may be an example of aspects of a receiving device as described herein. In some cases, the receiving device may be a UE 115, but may alternatively be a base station 105. Wireless device 1105 may include receiver 1110, reception stream processor 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to SPR CFR, etc.). Information may be passed on to other components of the device. The receiver 1110 may be an example of aspects of the transceiver 1335 described with reference to FIG. 13. The receiver 1110 may utilize a single antenna or a set of antennas.

Reception stream processor 1115 may be an example of aspects of the reception stream processors as described with reference to FIGS. 2 through 5 and 10. Reception stream processor 1115 may include reception manager 1125, peak detector 1130, and signal decoder 1135. Reception manager 1125 may receive a reduced signal, for example, via receiver 1110.

Peak detector 1130 may detect a first peak of the reduced signal based on a pattern of the first peak, where the pattern of the first peak may be based on a combined series of cancellation pulses. Peak detector 1130 may detect the first peak based on identifying a series of cancellation pulses subtracted from an input signal to obtain the combined series of cancellation pulses. Peak detector 1130 may detect a second peak of the reduced signal based on a pattern of the second peak, where decoding the reduced signal may be based on detecting the second peak. In some cases, the pattern of the first peak and the pattern of the second peak may be the same. In some cases, the pattern of the first peak may include a clipping pattern. Signal decoder 1135 may decode the reduced signal based on detecting the first peak.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Figure 12:
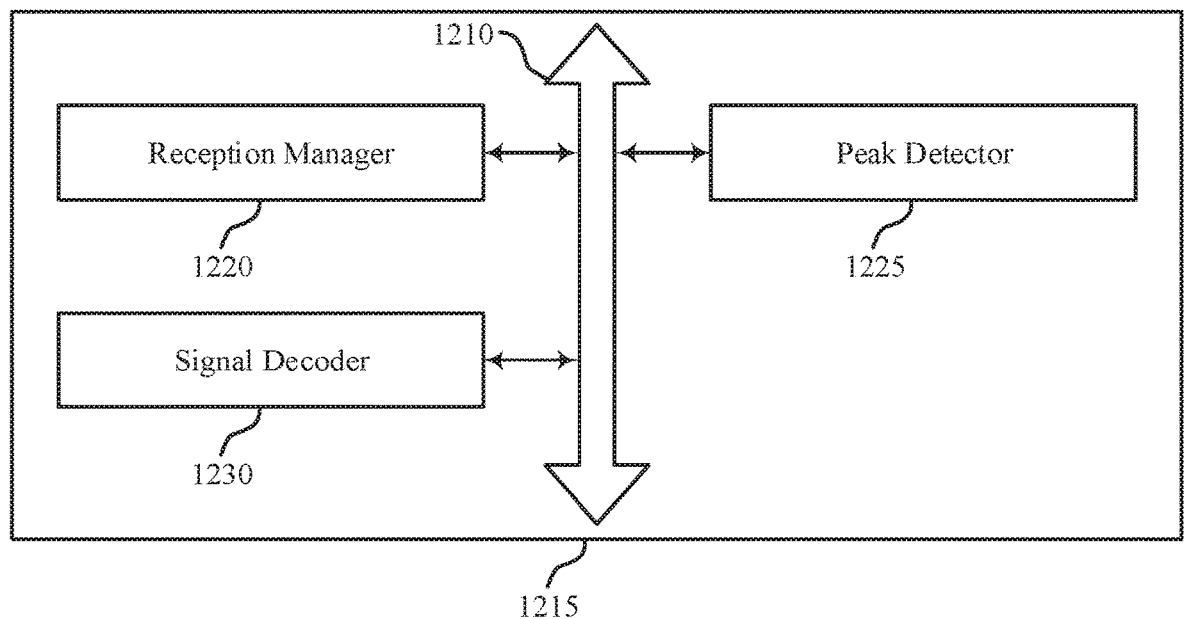
FIG. 12 shows a block diagram of a reception stream processor that supports SPR CFR in accordance with aspects of the present disclosure.

FIG. 12 shows a block diagram 1200 of a reception stream processor 1215 that supports SPR CFR in accordance with aspects of the present disclosure. The reception stream processor 1215 may be an example of aspects of a reception stream processor described with reference to FIGS. 2 through 5, 10, and 11. The reception stream processor 1215 may include reception manager 1220, peak detector 1225, and signal decoder 1230. Each of these modules may communicate, directly or indirectly, with one another (e.g., via one or more buses 1210).

Reception manager 1220 may receive a reduced signal. In some cases, an amplitude of the reduced signal is less than an amplitude threshold.

Peak detector 1230 may detect a first peak of the reduced signal based on a pattern of the first peak, where the pattern of the first peak may be based on a combined series of cancellation pulse. Peak detector 1230 may detect the first peak based on identifying a series of cancellation pulses subtracted from an input signal to obtain the combined series of cancellation pulses. Peak detector 1230 may detect a second peak of the reduced signal based on a pattern of the second peak, where decoding the reduced signal may be based on detecting the second peak. In some cases, the pattern of the first peak and the pattern of the second peak may be the same. In some cases, the pattern of the first peak may include a clipping pattern. Signal decoder 1235 may decode the reduced signal based on detecting the first peak.

Figure 13:
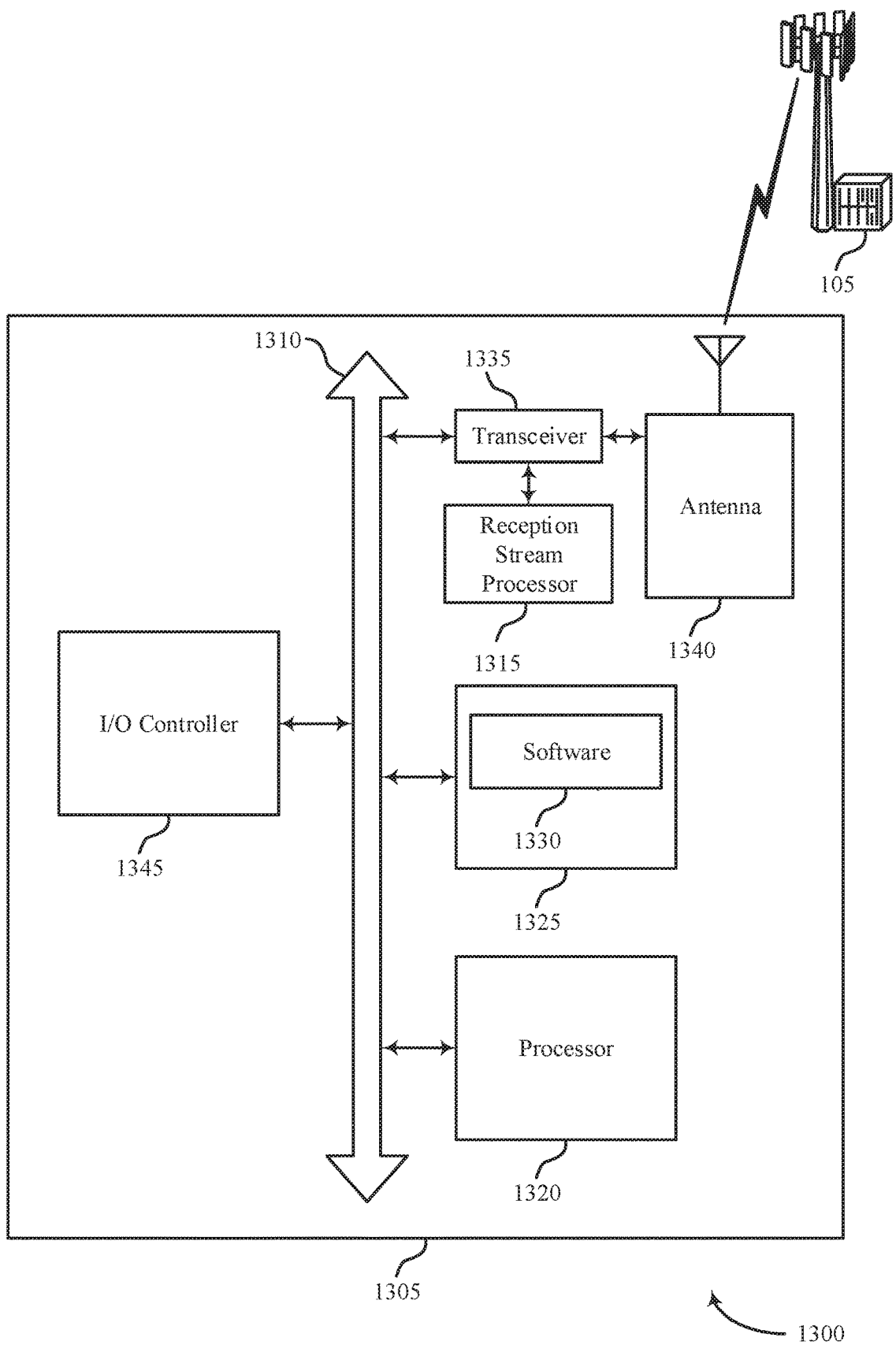
FIG. 13 illustrates a block diagram of a system including a device that supports SPR CFR in accordance with aspects of the present disclosure.

FIG. 13 illustrates a block diagram of a system 1300 including a device 1305 that supports SPR CFR in accordance with aspects of the present disclosure. Device 1305 may be an example of or include the components of a UE 115 as described with reference to FIGS. 1 through 12 and 14 through 18. Device 1305 may include components for bi-directional voice and data communications including components for transmitting and receiving communications, including a reception stream processor 1315, processor 1320, memory 1325, software 1330, transceiver 1335, antenna 1340, and I/O controller 1345. These components may be in electronic communication via one or more busses (e.g., bus 1310). Device 1305 may communicate wirelessly with one or more base stations 105 or UEs 115.

Processor 1320 may include an intelligent hardware device, (e.g., a general-purpose processor, a DSP), a CPU, a microcontroller, an ASIC, a FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting frequency and time domain multiplexing for low PAPR waveform design with multiple streams).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware and/or software operation such as the interaction with peripheral components or devices.

Software 1330 may include code to implement aspects of the present disclosure, including code to support frequency and time domain multiplexing for low PAPR waveform design with multiple streams. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may coordinate with a reception stream processor 1315 to process signals for uplink transmission. For example, reception stream processor 1315 may include aspects of reception stream processors as described with reference to FIGS. 2 through 5 and 10 through 12. In some cases, reception stream processor 1315 may receive a reduced signal, detect a first peak of the reduced signal based at least in part on a pattern of the first peak, the pattern of the first peak based on a combined series of cancellation pulses, and decode the reduced signal based on detecting the first peak.

In some cases, reception stream processor 1315 may detect the first peak based on identifying a series of cancellation pulses subtracted from an input signal to obtain the combined series of cancellation pulses. In some cases, reception stream processor 1315 may detect a second peak of the reduced signal based on a pattern of the second peak, where decoding the reduced signal may be based at least in part on detecting the second peak. In some cases, the pattern of the first peak and the pattern of the second peak may be the same. In some cases, the pattern of the first peak may include a clipping pattern. In some cases, the amplitude of the reduced signal may be less than an amplitude threshold.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may include components such as digital-to-analog or analog-to-digital converters, downconverters, upconverters, filters, etc. In some cases, the wireless device may include a single antenna 1340. However, in some cases the device may have more than one antenna 1340, which may be capable of concurrently transmitting or receiving multiple wireless transmissions.

I/O controller 1345 may manage input and output signals for device 1305. I/O controller 1345 may also manage peripherals not integrated into device 1305. In some cases, I/O controller 1345 may represent a physical connection or port to an external peripheral. In some cases, I/O controller 1345 may utilize an operating system such as iOS®, ANDROID®, MS-DOS®, MS-WINDOWS®, OS/2®, UNIX®, LINUX®, or another known operating system. In other cases, I/O controller 1345 may represent or interact with a modem, a keyboard, a mouse, a touchscreen, or a similar device. In some cases, I/O controller 1345 may be implemented as part of a processor. In some cases, a user may interact with device 1305 via I/O controller 1345 or via hardware components controlled by I/O controller 1345.

Figure 14:
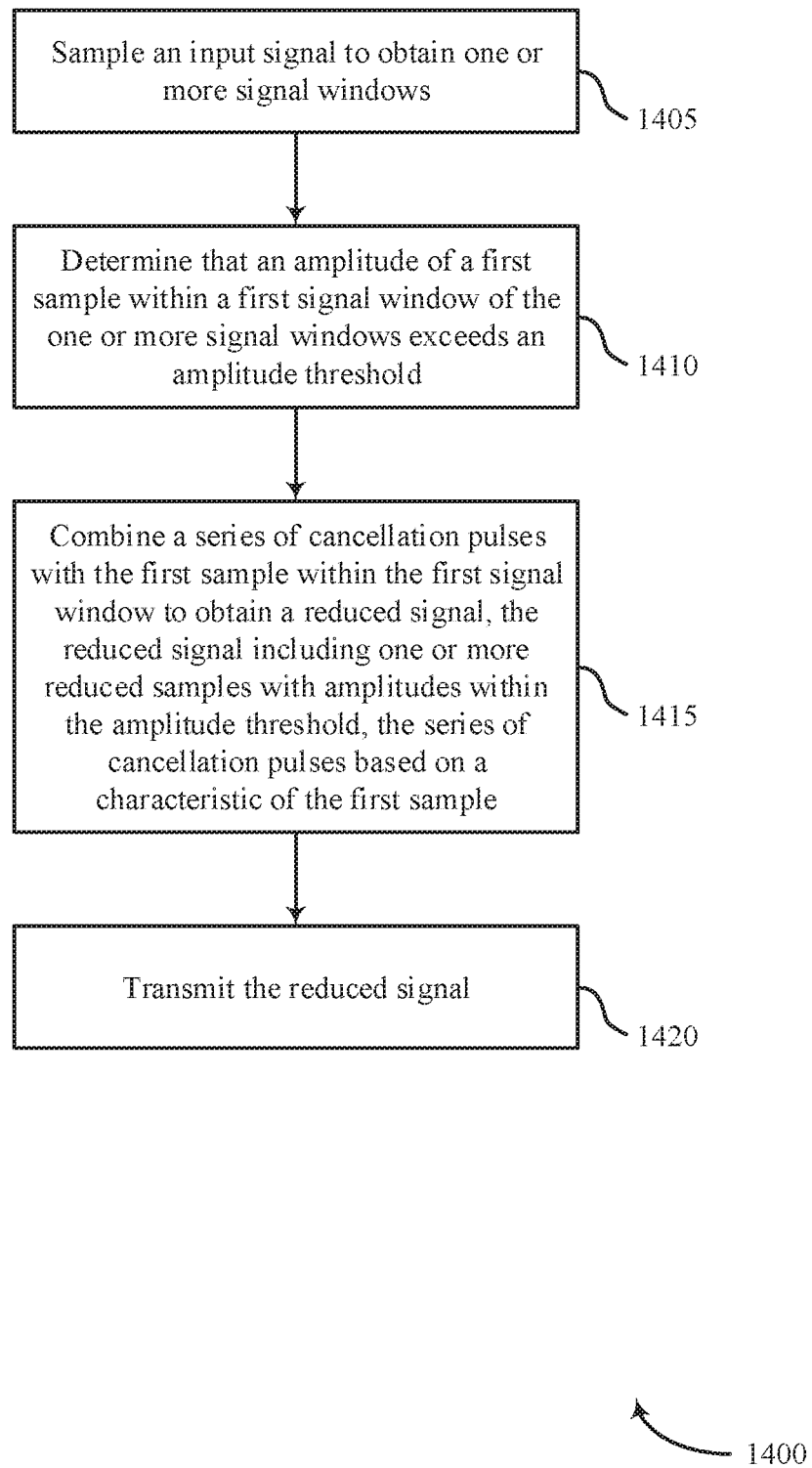
FIGS. 14 and 15 show flowcharts illustrating methods for SPR CFR in accordance with aspects of the present disclosure.

FIG. 14 shows a flowchart illustrating a method 1400 for SPR CFR in accordance with aspects of the present disclosure. The operations of method 1400 may be implemented by a UE 115 or its components as described herein. Additionally or alternatively, the operations of method 1400 may be implemented by a base station 105 or its components as described herein. For example, the operations of method 1400 may be performed by a transmission stream processor as described with reference to FIGS. 2 through 9. In some examples, a UE 115 or base station 105 may execute a set of codes to control the functional elements of the device to perform the functions described below. Additionally or alternatively, the UE 115 or the base station 105 may perform aspects of the functions described below using special-purpose hardware.

At 1405, the transmitting device may sample an input signal to obtain one or more signal windows. The operations of 1405 may be performed according to the methods described herein. In certain examples, aspects of the operations of 1405 may be performed by a transmission stream processor as described with reference to FIGS. 2 through 9.

At 1410, the transmitting device may determine that an amplitude of a first sample within a first signal window of the one or more signal windows exceeds an amplitude threshold. The operations of 1410 may be performed according to the methods described herein. In certain examples, aspects of the operations of 1405 may be performed by a transmission stream processor as described with reference to FIGS. 2 through 9.

At 1415, the transmitting device may combine a series of cancellation pulses with the first sample within the first signal window to obtain a reduced signal, the reduced signal comprising one or more reduced samples with amplitudes within the amplitude threshold, the series of cancellation pulses based at least in part on a characteristic of the first sample. The operations of 1415 may be performed according to the methods described herein. In certain examples, aspects of the operations of 1405 may be performed by a transmission stream processor as described with reference to FIGS. 2 through 9.

At 1420, the transmitting device may transmit the reduced signal. The operations of 1420 may be performed according to the methods described herein. In certain examples, aspects of the operations of 1405 may be performed by a transmission stream processor as described with reference to FIGS. 2 through 9.

Figure 15:
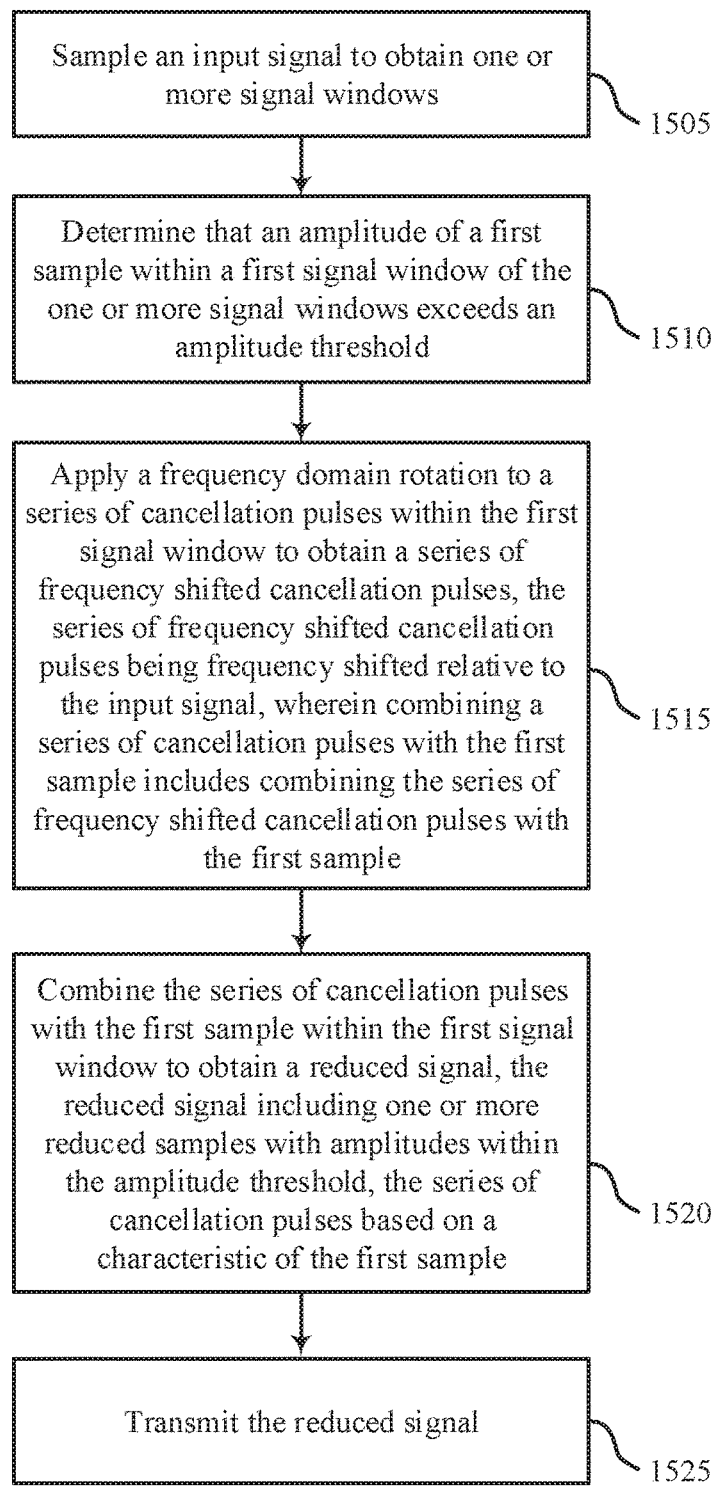

FIG. 15 shows a flowchart illustrating a method 1500 for SPR CFR in accordance with aspects of the present disclosure. The operations of method 1500 may be implemented by a UE 115 or its components as described herein. Additionally or alternatively, the operations of method 1500 may be implemented by a base station 105 or its components as described herein. For example, the operations of method 1500 may be performed by a transmission stream processor as described with reference to FIGS. 2 through 9. In some examples, a UE 115 or base station 105 may execute a set of codes to control the functional elements of the device to perform the functions described below. Additionally or alternatively, the UE 115 or the base station 105 may perform aspects of the functions described below using special-purpose hardware.

At 1505, the transmitting device may sample an input signal to obtain one or more signal windows. The operations of 1505 may be performed according to the methods described herein. In certain examples, aspects of the operations of 1505 may be performed by a transmission stream processor as described with reference to FIGS. 2 through 9.

At 1510, the transmitting device may determine that an amplitude of a first sample within a first signal window of the one or more signal windows exceeds an amplitude threshold. The operations of 1510 may be performed according to the methods described herein. In certain examples, aspects of the operations of 1510 may be performed by a transmission stream processor as described with reference to FIGS. 2 through 9.

At 1515, the transmitting device may apply a frequency domain rotation to the series of cancellation pulses within the first signal window to obtain a series of frequency shifted cancellation pulses, where the series of frequency shifted cancellation pulses may be frequency shifted relative to the input signal. Combining a series of cancellation pulses with the first sample may include combining the series of frequency shifted cancellation pulses with the first sample. The operations of 1515 may be performed according to the methods described herein. In certain examples, aspects of the operations of 1515 may be performed by a transmission stream processor as described with reference to FIGS. 2 through 9.

At 1520, the transmitting device may combine the series of cancellation pulses with the first sample within the first signal window to obtain a reduced signal, where the reduced signal may include one or more reduced samples with amplitudes within the amplitude threshold. The series of cancellation pulses may be based on a characteristic of the first sample. The operations of 1520 may be performed according to the methods described herein. In certain examples, aspects of the operations of 1520 may be performed by a transmission stream processor as described with reference to FIGS. 2 through 9.

At 1525, the transmitting device may transmit the reduced signal. The operations of 1525 may be performed according to the methods described herein. In certain examples, aspects of the operations of 1525 may be performed by a transmission stream processor as described with reference to FIGS. 2 through 9.

Techniques described herein may be used for various wireless communications systems such as code division multiple access (CDMA), time division multiple access (TDMA), frequency division multiple access (FDMA), OFDMA, SC-FDMA and other systems. A CDMA system may implement a radio technology such as CDMA2000, UTRA, etc. CDMA2000 covers IS-2000, IS-95, and IS-856 standards. IS-2000 Releases may be commonly referred to as CDMA2000 1X, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a FPGA or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    sampling an input signal to obtain one or more signal windows;
    determining that an amplitude of a first sample within a first signal window of the one or more signal windows exceeds an amplitude threshold;
    combining a series of cancellation pulses with the first sample within the first signal window to obtain a reduced signal, the reduced signal comprising one or more reduced samples with amplitudes within the amplitude threshold, wherein the series of cancellation pulses comprises a first cancellation pulse and a second cancellation pulse, the second cancellation pulse being based at least in part on a first reduction of the first sample using the first cancellation pulse, and wherein the series of cancellation pulses is based at least in part on a characteristic of the first sample; and
    transmitting the reduced signal.

2. The method of claim 1, wherein the characteristic of the first sample comprises an envelope of the first sample.

3. The method of claim 1, wherein the series of cancellation pulses is based at least in part on a phase of the first sample.

4. The method of claim 1, further comprising:
    determining that an amplitude of a second sample within a second signal window of the one or more signal windows of the reduced signal exceeds the amplitude threshold, wherein the series of cancellation pulses is based at least in part on a characteristic of the second sample.

5. The method of claim 4, wherein an envelope of the second sample is based at least in part on the first cancellation pulse, and the second cancellation pulse is based at least in part on an envelope of the second sample.

6. The method of claim 4, wherein the series of cancellation pulses is based at least in part on a phase of the first sample and a phase of the second sample, wherein the phase of the first sample and the phase of the second sample are different.

7. The method of claim 4, further comprising:
    determining that an amplitude of a third sample within a third signal window of the one or more signal windows exceeds the amplitude threshold, wherein the series of cancellation pulses is based at least in part on an envelope of the third sample.

8. The method of claim 1, wherein the series of cancellation pulses comprises a recursive series of cancellation pulses.

9. The method of claim 1, wherein an amplitude of the each of the one or more reduced samples of the reduced signal is less than the amplitude threshold.

10. The method of claim 1, further comprising:
    applying a frequency domain rotation to the series of cancellation pulses within the first signal window to obtain a series of frequency shifted cancellation pulses, the series of frequency shifted cancellation pulses being frequency shifted relative to the input signal, wherein combining the series of cancellation pulses with the first sample comprises combining the series of frequency shifted cancellation pulses with the first sample.

11. The method of claim 1, further comprising:
applying a first frequency domain rotation to the input signal to obtain a rotated input signal comprising the first sample.

12. The method of claim 11, further comprising:
applying a second frequency domain rotation to the reduced signal.

13. The method of claim 12, wherein the second frequency domain rotation is different than the first frequency domain rotation.

14. The method of claim 1, further comprising:
determining a length of the one or more signal windows based at least in part on a bandwidth of the input signal, a sampling rate of the input signal, a resource block allocation of the input signal, or a combination thereof.

15. The method of claim 1, wherein the series of cancellation pulses is based at least in part on a Hanning window.

16. The method of claim 15, wherein a length of the Hanning window is the same as a length of a signal window of the one or more signal windows.

17. The method of claim 1, further comprising:
processing the reduced signal with a filter to obtain a filtered reduced signal.

18. The method of claim 17, further comprising:
applying hard clipping to the filtered reduced signal to obtain an output signal to transmit the reduced signal.

19. The method of claim 18, wherein a peak-to-average power ratio (PAPR) of the output signal is within a target PAPR.

20. The method of claim 1, further comprising:
applying a trough conditioner to the input signal.

21. An apparatus for wireless communication, comprising:
means for sampling an input signal to obtain one or more signal windows;
means for determining that an amplitude of a first sample within a first signal window of the one or more signal windows exceeds an amplitude threshold;
means for combining a series of cancellation pulses with the first sample within the first signal window to obtain a reduced signal, the reduced signal comprising one or more reduced samples with amplitudes within the amplitude threshold, wherein the series of cancellation pulses comprises a first cancellation pulse and a second cancellation pulse, the second cancellation pulse being based at least in part on a first reduction of the first sample using the first cancellation pulse, and wherein the series of cancellation pulses is based at least in part on a characteristic of the first sample; and
means for transmitting the reduced signal.

22. An apparatus for wireless communication, comprising:
a processor;
memory in electronic communication with the processor; and
instructions stored in the memory and executable by the processor to cause the apparatus to:
sample an input signal to obtain one or more signal windows;
determine that an amplitude of a first sample within a first signal window of the one or more signal windows exceeds an amplitude threshold;
combine a series of cancellation pulses with the first sample within the first signal window to obtain a reduced signal, the reduced signal comprising one or more reduced samples with amplitudes within the amplitude threshold, wherein the series of cancellation pulses comprises a first cancellation pulse and a second cancellation pulse, the second cancellation pulse being based at least in part on a first reduction of the first sample using the first cancellation pulse, and wherein the series of cancellation pulses is based at least in part on a characteristic of the first sample; and
transmit the reduced signal.

23. The apparatus of claim 22, wherein the characteristic of the first sample comprises an envelope of the first sample.

24. The apparatus of claim 22, wherein the series of cancellation pulses is based at least in part on a phase of the first sample.

25. The apparatus of claim 22, wherein the instructions are further executable by the processor to cause the apparatus to:
determine that an amplitude of a second sample within a second signal window of the one or more signal windows of the reduced signal exceeds the amplitude threshold, wherein the series of cancellation pulses is based at least in part on a characteristic of the second sample.

26. The apparatus of claim 22, wherein the series of cancellation pulses comprises a recursive series of cancellation pulses.

27. The apparatus of claim 22, wherein the instructions are further executable by the processor to cause the apparatus to:
apply a frequency domain rotation to the series of cancellation pulses within the first signal window to obtain a series of frequency shifted cancellation pulses, the series of frequency shifted cancellation pulses being frequency shifted relative to the input signal, wherein the instructions to combine the series of cancellation pulses with the first sample comprise instructions to combine the series of frequency shifted cancellation pulses with the first sample; and
apply a second frequency domain rotation to the series of cancellation pulses within a second signal window.

28. The apparatus of claim 22, wherein the instructions are further executable by the processor to cause the apparatus to:
apply a first frequency domain rotation to the input signal to obtain a rotated input signal comprising the first sample; and
apply a second frequency domain rotation to the reduced signal.

29. The apparatus of claim 22, wherein the series of cancellation pulses is based at least in part on a Hanning window.

30. A non-transitory computer-readable medium storing code for wireless communication, the code comprising instructions executable by a processor to:
sample an input signal to obtain one or more signal windows;
determine that an amplitude of a first sample within a first signal window of the one or more signal windows exceeds an amplitude threshold;

combine a series of cancellation pulses with the first sample within the first signal window to obtain a reduced signal, the reduced signal comprising one or more reduced samples with amplitudes within the amplitude threshold, wherein the series of cancellation pulses comprises a first cancellation pulse and a second cancellation pulse, the second cancellation pulse being based at least in part on a first reduction of the first sample using the first cancellation pulse, and wherein the series of cancellation pulses is based at least in part on a characteristic of the first sample; and transmit the reduced signal.

\* \* \* \* \*